(12) United States Patent
Marwah et al.

(10) Patent No.: US 8,239,421 B1
(45) Date of Patent: Aug. 7, 2012

(54) TECHNIQUES FOR COMPRESSION AND PROCESSING OPTIMIZATIONS BY USING DATA TRANSFORMATIONS

(75) Inventors: Vineet Marwah, San Ramon, CA (US); Vikram Kapoor, Cupertino, CA (US); Jesse Kamp, Castro Valley, CA (US); Kam Shergill, Maidenhead (GB); Roger MacNicol, Hummelstown, PA (US); Manosiz Bhattacharyya, San Jose, CA (US); Amit Ganesh, San Jose, CA (US)

(73) Assignee: Oracle International Corporation, Redwood Shores, CA (US)

( * ) Notice: Subject to any disclaimer, the term of this patent is extended or adjusted under 35 U.S.C. 154(b) by 122 days.

(21) Appl. No.: 12/871,862

(22) Filed: Aug. 30, 2010

(51) Int. Cl.
*G06F 17/20* (2006.01)
(52) U.S. Cl. ........ 707/802; 707/809; 707/756; 382/245; 382/248
(58) Field of Classification Search .................. 707/809, 707/802, 756; 382/240, 244, 245, 248
See application file for complete search history.

(56) References Cited

U.S. PATENT DOCUMENTS

| | | | |
|---|---|---|---|
| 5,794,229 | A | 8/1998 | French et al. |
| 7,076,108 | B2 * | 7/2006 | Huang et al. ................. 382/240 |
| 7,225,249 | B1 * | 5/2007 | Barry et al. ................... 709/227 |
| 7,496,589 | B1 | 2/2009 | Jain et al. |
| 7,565,346 | B2 * | 7/2009 | Fan et al. ............................. 1/1 |
| 7,882,122 | B2 * | 2/2011 | Wong ........................... 707/760 |
| 8,073,777 | B2 * | 12/2011 | Barry et al. ..................... 705/50 |
| 2003/0108248 | A1 * | 6/2003 | Huang et al. ................. 382/240 |
| 2003/0212694 | A1 | 11/2003 | Potapov et al. |
| 2005/0027729 | A1 * | 2/2005 | Kuchinsky et al. ........... 707/100 |
| 2005/0210054 | A1 | 9/2005 | Harris |
| 2005/0216421 | A1 * | 9/2005 | Barry et al. ..................... 705/64 |
| 2005/0278324 | A1 * | 12/2005 | Fan et al. .......................... 707/6 |
| 2006/0100912 | A1 * | 5/2006 | Kumar et al. ..................... 705/4 |
| 2007/0109155 | A1 | 5/2007 | Fallon |
| 2008/0050025 | A1 | 2/2008 | Bashyam et al. |
| 2008/0071818 | A1 | 3/2008 | Apanowicz et al. |
| 2008/0162523 | A1 | 7/2008 | Kraus et al. |

(Continued)

OTHER PUBLICATIONS

Rabb, David, "How to Judge a Columnar Database", Information Management, website http://license.icopyright.net/user/viewFreeUse.act?fuid=MTMxMDAzMjU%3D, dated Dec. 14, 2007, 2 pages.

(Continued)

*Primary Examiner* — Jean M Corrielus
(74) *Attorney, Agent, or Firm* — Hickman Palermo Truong Becker Bingham Wong LLP

(57) ABSTRACT

Described herein are compression and processing optimizations by using data transformation techniques. In example embodiments, a byte-wise differential transformation is applied to columnar data represented as a list of length-value pairs to determine a list of delta pairs that is subsequently compressed and stored on persistent storage. A length separation transformation is applied to separate a list of length-value pairs into a length array and a corresponding data value array, where these two arrays are subsequently compressed and stored separately on persistent storage. A native number transformation is applied to a set of number values to remove the lengths stored in the number values, where the transformed set is stored on persistent storage instead of the original set of number values. A native datetime-type transformation is applied to a set of datetime values to generate an encoding that is used to encode the set of datetime values into an encoded set that is stored on persistent storage instead of the original set.

66 Claims, 11 Drawing Sheets

U.S. PATENT DOCUMENTS

| | | | |
|---|---|---|---|
| 2008/0294863 | A1 | 11/2008 | Faerber et al. |
| 2009/0234823 | A1* | 9/2009 | Wong .............................. 707/4 |
| 2009/0319536 | A1* | 12/2009 | Parker et al. ................... 707/10 |
| 2010/0278446 | A1 | 11/2010 | Ganesh et al. |
| 2010/0281004 | A1 | 11/2010 | Kapoor et al. |
| 2010/0281079 | A1 | 11/2010 | Marwah et al. |

OTHER PUBLICATIONS

MacNicol Roger et al, "Sybase IQ Multiplex-Designed for Analytics", Proceedings of the 30$^{th}$ VLDB Conference, dated 2004, 4 pages.

Sybase IQ, "Administration Guide", Document ID: 35375-01-1121-02, dated Sep. 19, 1997, 426 pages.

Sybase IQ, "Gaining the Performance Edge Using a Column-Oriented Database Management System", 12 pages, dated Mar. 2009.

Sybase IQ, "An Advanced Columnar Data Warehouse Architecture", Winter Corporation, 17 pages, Dated Jun. 2010.

Winter Corporation, "Demonstrating Efficiency in Large-Scale Data Warehousing", A review of new TPC-H results for the Sun-Sybase IQ Platform, 20 pages, dated in 2003.

U.S. Appl. No. 12/769,508, Apr. 28, 2010, Office Action.

\* cited by examiner

TECHNIQUES FOR COMPRESSION AND PROCESSING OPTIMIZATIONS BY USING DATA TRANSFORMATIONS

CROSS-REFERENCE TO RELATED APPLICATIONS

This application is related to U.S. application Ser. No. 12/617,669, filed on Nov. 12, 2009 by Amit Ganesh et al. and titled "STRUCTURE OF HIERARCHICAL COMPRESSED DATA STRUCTURE FOR TABULAR DATA", the entire contents of which is hereby incorporated by reference as if fully set forth herein.

This application is related to U.S. application Ser. No. 12/769,508, filed on Apr. 28, 2010 by Vineet Marwah et al. and titled "COMPRESSION ANALYZER", the entire contents of which is hereby incorporated by reference as if fully set forth herein.

This application is related to U.S. application Ser. No. 12/769,205, filed on Apr. 28, 2010 by Vikram Kapoor et al. and titled "STORING COMPRESSION UNITS IN RELATIONAL TABLES", the entire contents of which is hereby incorporated by reference as if fully set forth herein.

FIELD OF THE INVENTION

The present invention relates to data transformation processing.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Data stored by individual users and organizations has been growing exponentially every year for various reasons. For example, some companies and organizations need to keep data preserved for longer durations of time because of various legal and auditing requirements. In another example, companies that provide various user services (e.g., such as web hosting, e-mail, social networking, on-line shopping, etc.) need to meet an increasing demand to store more and more data generated by the users. Consequently, this ever-increasing need for more and more data storage becomes a problem because purchasing, installing, supporting, and expanding the physical storage space in database and other storage systems becomes very expensive.

How data is physically stored in database or other storage systems can have a significant effect on (1) how much storage space the data consumes, and (2) how efficiently the data can be accessed, retrieved, and manipulated. If physically stored in an inefficient manner, the data may consume more storage space than desired, and/or may result in slow storage, retrieval and/or update times.

Often, the physical storage of data involves a trade-off between storage footprint and processing speed. For example, a set of data (e.g., such as a file, a table, or a column of a table) may be stored on a physical storage device in compressed or non-compressed form. If non-compressed, the set of data can be processed faster but will take more storage space on the physical storage device. If compressed, the set of data will take less storage space on the physical storage device, but the entire set of data (or at least a portion thereof) will typically have to be retrieved and decompressed when some data manipulation operation needs to be performed thereon; after the data manipulation operation is completed, the set of data will typically need to be re-compressed before being stored back on the physical storage device. However, such compression and decompression operations take time and may consume a lot of computing resources (e.g., such as CPU time and memory), thereby resulting in slower processing and degraded computer system performance.

The best compression/performance balance is particularly difficult to achieve when the data being processed includes data items having various different data types and formats. For example, a set of tabular data may include some columns that contain character strings, some columns that contain numbers, and some columns that contain datetime values. The character strings may be highly compressible using a particular compression mechanism, but applying the same compression mechanism to the numbers or the datetime values contained in the tabular data may yield no benefit. On the other hand, the datetime values contained in the spreadsheet may be highly compressible using a compression mechanism that yields no benefit when used on character strings or numbers. Under circumstances such as these, whether the tabular data is compressed using one of the compression mechanisms or is not compressed at all, the result is inevitably sub-optimal with respect to the required storage space and the desired processing performance.

BRIEF DESCRIPTION OF THE DRAWINGS

The techniques described herein are illustrated by way of example, and not by way of limitation, in the figures of the accompanying drawings and in which like reference numerals refer to similar elements and in which.

DETAILED DESCRIPTION

Figure 1:
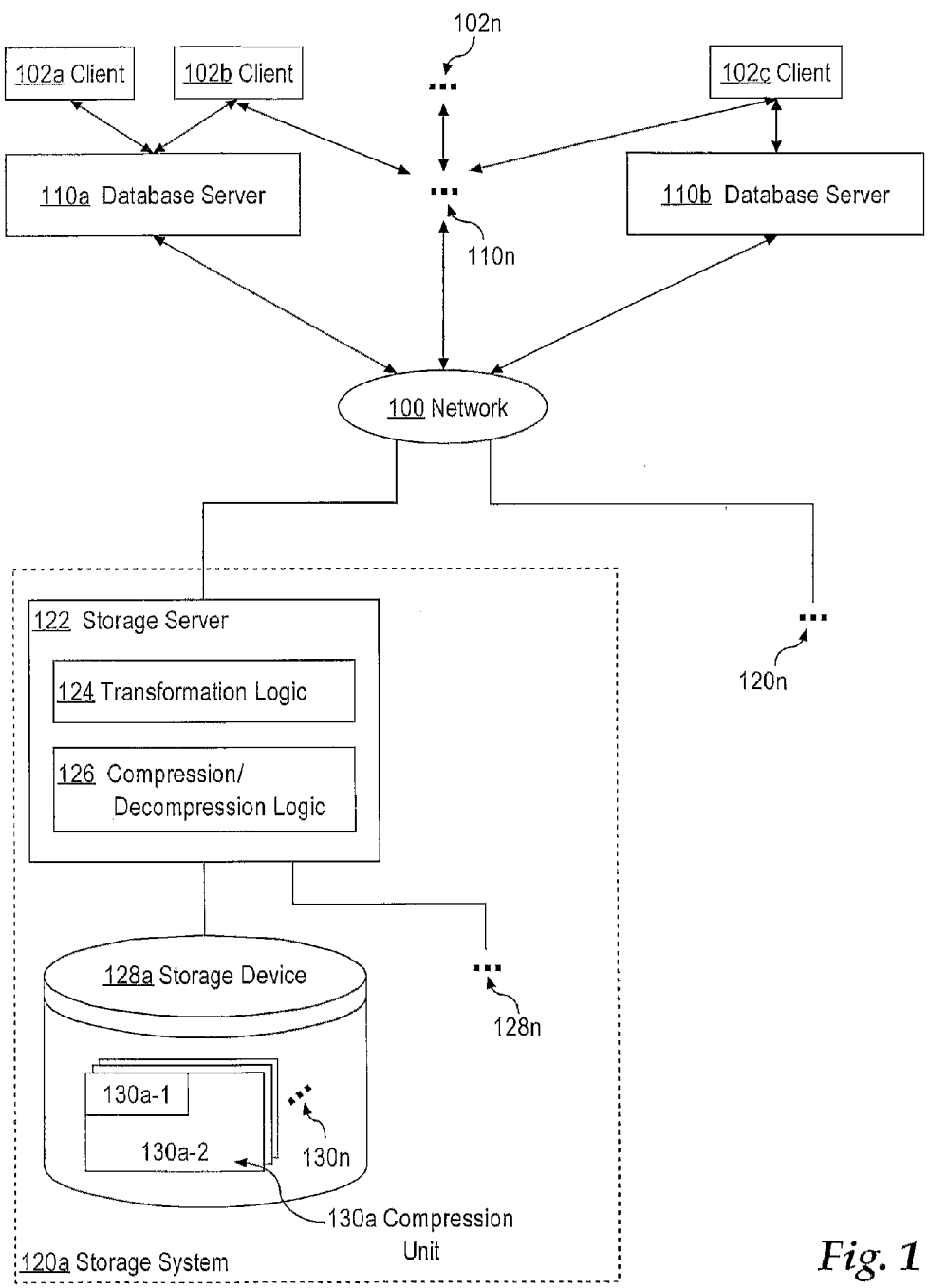
FIG. 1 a block diagram that illustrates an example operational context according to one embodiment.

In the following description, for the purposes of explanation, numerous specific details are set forth in order to provide a thorough understanding of the techniques described herein for compression and processing optimizations by using data transformations. It will be apparent, however, that the techniques described herein may be practiced without these specific details. In other instances, well-known structures and devices are shown in block diagram form in order to avoid unnecessarily obscuring the techniques described herein.

OVERVIEW

Described herein are compression and processing optimizations by using data transformation techniques. The data transformation techniques described herein include byte-wise differential transformation, length separation transformation, native number transformation, and native datetime-type transformation.

In an example embodiment, a byte-wise differential transformation is applied to columnar data to generate transformed data. The columnar data is represented as a list of length-value pairs, where each length-value pair includes a length followed by a data value having a number of bytes equal to the length. To transform the columnar data, the first length-value pair from the list in the columnar data is stored as the base length-value pair in the transformed data. Then, starting with the first length-value pair, a delta pair is computed for each two consecutive length-value pairs in the list in the columnar data. The delta pair includes a delta length and a delta value, where the delta length is computed as the byte-wise numerical difference between the lengths included in the two consecutive length-value pairs, and the delta value is computed as the byte-wise numerical difference between the data values included in the two consecutive length-value pairs. The list of computed delta pairs is then stored after the base length-value pair in the transformed data. After obtaining the transformed data in this manner, the transformed data is compressed by using a suitable compression mechanism, and the thusly compressed data is stored into persistent data storage.

In an example embodiment, a length separation transformation is applied to columnar data to generate transformed data. The columnar data is represented as a list of length-value pairs, where each length-value pair includes a length followed by a data value having a number of bytes equal to the length. To transform the columnar data, each length-value pair in the list in the columnar data is separated into a length and a data value. Then, all of the separated lengths are stored together as entries in a first array, and all of the separated data values are stored together as entries in a separate second array, where the entries in the first array respectively correspond to the entries in the second array. The first and the second array represent the transformed data. After obtaining the transformed data in this manner, the transformed data is compressed by using a suitable compression mechanism, and the thusly compressed data is stored into persistent data storage.

In an example embodiment, a native number transformation is applied to a set of number values. Each number value is formatted to include: an exponent; a list of bytes that comprise the number value, where the top-level bit in each byte of the list of bytes is the same and is equal to "0"; and a length that is the sum of the number of bytes in the exponent and in the list of bytes. Each number value in the set is then transformed by setting to "1" the top-level bit in the last byte of the list of bytes for that number value (thereby marking the end byte of the number value), and by removing the length from the number value (which is now rendered redundant since the length of each number value can be determined on the fly by sequentially scanning the transformed data for the marked end byte of each number value stored in the transformed data). After obtaining a transformed set of number values in this manner, the transformed set is stored into persistent data storage instead of storing the original set of number values. Notably, the transformed set is smaller in size than the original set because the number values in the transformed do not store their respective lengths.

In an example embodiment, a native datetime-type transformation is applied to a set of datetime values. Each datetime value in the set is comprised of bytes that are organized according to a fixed list of byte positions, where each byte position, in the list of byte positions, corresponds to a set of one or more bytes. To transform the set of datetime values, a cardinality is first determined for each byte position from across the bytes of all datetime values, in the set of datetime values, that correspond to that byte position. An encoding is created that includes, for each byte position, a number of distinct entries that is equal to the cardinality for that byte position. Then, each datetime value in the set is transformed into a corresponding encoded value by first determining for each set of one or more bytes, of that datetime value, that corresponds to a byte position in the list of byte positions, an entry in the encoding that corresponds to the byte position of that set of one or more bytes; and then combining, in the order of the list of byte positions, the determined entries that correspond to the sets of one or more bytes of that datetime value to obtain the corresponding encoded value. After determining the set of encoded values in this manner, the set of encoded values is stored into persistent data storage instead of storing the original set of datetime values. Notably, since the encoding uses a small number of entries (per the computed cardinalities), these entries are smaller in size than the bytes in the original datetime values and, consequently, the set of encoded values is smaller in size than the original set of datetime values.

Example Operational Context

FIG. 1 is a block diagram that illustrates an example operational context in which embodiments of the data transformation techniques described herein may be implemented. It is noted that while the example operational context of FIG. 1 illustrates various components (e.g., such as database servers, network, and storage servers), embodiments of the data transformation techniques described herein are not limited to being implemented in operational contexts that include all of these components or any combinations thereof. Thus, the example operational context of FIG. 1 is to be regarded in an illustrative rather than a restrictive sense.

In the example operational context of FIG. 1, one or more storage systems 120n provide data storage to one or more database servers 110n that are connected to the storage servers over network 100. Network 100 may comprise one or more network infrastructure elements (e.g., such as bridges, switches, routers, etc.) that are configured to transfer data requests and data responses between database servers 110n and storage systems 120n. One example of such network is an Infiniband network that comprises switches with interfaces that provide for bi-directional communication links between database servers and storage systems.

Database servers 110n are configured to provide one or more clients 102n with access to data stored in one or more databases. For example, as illustrated in FIG. 1, database server 110a is communicatively connected (e.g., over a network and/or point-to-point links) to clients 102a and 102b, and database server 110b is communicatively connected to client 102c. Each of database servers 110n may service requests from multiple clients, which may be database applications or other programs that are configured to store, access, and manipulate data that is maintained by the database servers.

As used herein, "server" refers to one or more software components which, when executed, may be allocated computational resources (e.g., such as memory, CPU time, and/or disk storage space) in order to perform one or more functionalities. "Database server" refers to a server that is operable to perform various functionalities against one or more databases (e.g., such as relational and object-relational databases). For example, by utilizing its allocated computational resources, a database server may be operable to perform various data management functions (including, but not limited to, controlling and facilitating access to particular databases, processing requests by clients to access particular databases, and processing requests by clients to add, delete, or modify data in particular databases), as well as database management functions (including, but not limited to, creating databases and tables, allocating disk space for databases and tables, and creating and maintaining user login information, role information, and security policy information). In clustered operational environments, a database server may be a server instance that operates as part of a cluster of database server instances that is operable to perform data management functions and database management functions against one or more databases.

Referring to FIG. 1, one or more of database servers 110*n* are configured to store data in one or more of storage systems 120*n*. For example, database server 110*a* is configured to send data for storage to computer system 120*a*, where the data can be some or all of the data of one or more databases managed by database server 110*a*. It is noted that, in addition to a storage system such as storage system 120*a*, database server 110*a* may also be configured to store portions of the one or more databases on storage devices that are local to the database server.

In the example operational context of FIG. 1, each of storage systems 120*n* is a self-contained computing device whose hardware is physically distinct from the hardware of the one or more computing devices on which database servers 110*n* are configured to execute. It is noted, however, that this hardware separation is not to be regarded in a restrictive sense because in other operational contexts one or more of the storage systems may be configured to execute on the same hardware as one or more of the database servers.

Each of storage systems 120*n* comprises a storage server that is operatively and/or communicatively connected to one or more persistent storage devices (e.g., such as optical or magnetic disks). For example, storage system 120*a* comprises storage server 122 and one or more storage devices 128*n*. A storage server, such as storage server 122, includes logic for storing, retrieving, managing, and providing access to the data stored on storage devices 128*n*. As used herein, "logic" refers to a set of instructions which, when executed by one or more processors, are operable to perform one or more functionalities. In various embodiments and implementations, any such logic may be implemented as one or more software components that are executable by one or more processors or as any combination of one or more software and hardware components such as Application-Specific Integrated Circuits (ASICs).

In the example operational context of FIG. 1, a storage server such as storage server 122 comprises data handling logic (not shown in FIG. 1) that is configured to receive discrete sets of data from a database server and to store these data sets in one or more compression units on storage devices 128*n*. As used herein, "compression unit" refers to a data structure that is used to store, on a physical storage device, data that logically resides in or belongs to any type of table-like structure. On the physical storage device, the compression unit may be stored in one or more disk blocks of the same or varying size.

A compression unit comprises a header section and a compressed section, where the header section stores metadata information that describes the data stored in the compression section. For example, with reference to FIG. 1, compression unit 130*a* is stored on storage device 128*a* and includes header 130*a*-1 and compressed section 130*a*-2. The metadata information stored in header 130*a*-1 may include, but is not limited to, information indicating the format of the data being stored in compressed section 130*a*-2 (e.g., such as row-major or column-major format), information indicating the tables and/or columns to which the data being stored belongs, information indicating the particular table rows to which the data being stored belongs (e.g., such row identifiers or ROWIDs), information indicating transformation and/or compression mechanism(s) that are used to transform and/or compress the data that is stored as the contents of compressed section 130*a*-2, and information indicating any other compression units to which compression unit 130*a* is related (e.g., such as parent or child compression units).

In the example operational context of FIG. 1, the data handling logic is also configured for reading data from storage devices 128*n*, and for performing various data manipulation operations on the retrieved data as indicated in requests received from a database server such as database server 110*a*. For example, such requests may include metadata information (e.g., such as information indicating a query predicate) that instructs the data handling logic to filter the retrieved data prior to returning it to the database server by performing selection and/or projection operations based on parameters that are specified in the metadata information.

According to the techniques described herein, a storage server such as storage server 122 includes transformation logic 124 and compression/decompression logic 126. Transformation logic 124 is configured to transform discrete sets of data received by storage server 122 in accordance with one or more of the data transformation techniques described herein. For example, transformation logic 124 is configured and operable to transform the received data sets by applying one or more of the byte-wise differential transformation technique, the length separation transformation technique, the native number transformation technique, and the native datetime-type transformation technique. Further, in response to requests for data from a database server, transformation logic 124 is also configured and operable to generate, from the data in compression units 130*n*, the requested data in its original form by applying the reverse of those data transformations that had been used to transform the data when the data was stored in the compression units.

The compression/decompression logic 126 of storage server 122 is configured to compress data sets according to one or more compression mechanisms and to store the compressed data as contents in the compressed sections of one or more of compression units 130*n*. Further, in response to requests for data from a database server, compression/decompression logic 126 is also configured and operable to decompress data that is retrieved from the compressed sections of one or more compression units. Examples of compression mechanisms that can be used by compression/decompression logic 126 to process data include, but are not limited to, the LZ77 compression mechanism, the LZ78 compression mechanism, the LZO compression mechanism, the LZW compression mechanism, the LZMA compression mechanism, the GZIP and PKZIP families of compression mechanisms, the BZ2 compression mechanism, the PPM/PAQ compression mechanism, and any other now known or later developed compression mechanism that is suitable for compressing data managed by a database server such as database server 110a.

In an example operation, database server 110a sends a request to storage server 122 to store a set of data, where the set of data is included in, or is otherwise associated with, the request. In response to the request, storage server 122 invokes a data handling logic to process the received set of data—for example, by analyzing the set of data and determining what transformation techniques and/or compression mechanisms would yield better compressions and/or processing performance upon retrieval. Then, storage server 122 or a component thereof (e.g., such as the data handling logic) invokes transformation logic 124 and instructs the transformation logic to perform one or more transformations on the set of data. When invoked, transformation logic 124 transforms the set of data according to one or more of the data transformation techniques described herein, and passes the obtained transformed data to compression/decompression logic 126. Compression/decompression logic 126 applies to the transformed data one or more compression mechanisms that may be determined by the compression/decompression logic itself and/or by another component of storage server 122. Thereafter, storage server 122 (or a component thereof, e.g., such as the data handling logic) creates and initializes compression unit 130a and then stores the compressed data therein, where storing the compressed data in compression unit 130a includes: storing in header 130a-1 the necessary metadata information that describes the set of data received from the database server 110a; and storing in compressed section 130a-2 the compressed data that is generated by the compression/decompression logic 126.

Thereafter, when database server 110a needs to access the data stored in compression unit 130a, the database server sends a request to storage server 122 to retrieve the data. In response to the request, storage server 122 (or a component thereof such as the data handling logic) determines that the requested data is stored in compression unit 130a and retrieves the contents of that compression unit. Based on the metadata information stored in header 130a-1, storage server 122 or a component thereof determines what compression mechanisms and transformation techniques were applied to the data when the data was stored by the storage server. Then, storage server 122 or a component thereof (e.g., such as the data handling logic) invokes compression/decompression logic 126 to decompress the contents stored in compressed section 130a-2 of compression unit 130a. After decompression is performed, compression/decompression logic 126 passes the decompressed data to transformation logic 124, and transformation logic 124 performs the necessary reverse data transformations in order to obtain the original set of data. Thereafter, if requested by database server 110a, storage server 122 (or a component thereof, e.g., such as the data handling logic) performs any filtering operations on the set of data generated by transformation logic 124, and returns the result to database server 110n.

In this manner, the data transformation techniques described herein are used to provide for better compression and performance optimizations for storing and retrieving data in storage systems that are configured to provide physical storage to database servers.

Byte-Wise Differential Transformation

The data transformation techniques described herein include a byte-wise differential transformation. The byte-wise differential transformation is a lossless transformation, which means that the original data can be fully re-generated by applying a reverse transformation to data that has been previously transformed.

The byte-wise differential transformation described herein involves computing the byte-by-byte numeric differences between two consecutive data values each having one or more bytes. In other words, numerical differences are computed between the corresponding bytes from the two consecutive data values. It is noted that the byte-wise differential transformation described herein is different from mechanisms that compute a bit-wise XOR difference. For example, for the two values of Value_A: "0010101011011010" (decimal "10970") and
Value_B: "0000100100110001" (decimal "2353"), a bit-wise XOR mechanism would apply the operation "Value_A XOR Value_B" to yield an XOR-ed value of
"0010001111101011" (decimal "9195").

In contrast, the byte-wise differential transformation described herein would yield a byte-wise difference of
"0010000110101001" (decimal "8617"), which is the result of subtracting the first byte in Value B ("00001001") from the first byte in value A ("00101010") and then subtracting the second byte in Value B ("00110001") from the second byte in Value A ("11011010").

It is noted that the byte-wise differential transformation not only produces a different result from a bit-wise XOR mechanism when applied to the same data values, but also differs in several other aspects. First, the byte-wise differential transformation described herein does not require the two input data values to be of the same length. In contrast, in order to produce a lossless transformation, the bit-wise XOR mechanism requires the two input data values to have the exact same length (which implies that input values of varying lengths need to be padded to the proper length). Second, it was determined that the byte-wise differential transformation produces transformed data that can be compressed at better compression ratios than transformed data produced by the bit-wise XOR mechanism. This result is unexpected because the bit-wise XOR mechanism produces data values that have uniform length, so therefore theoretically transformed data produced by the bit-wise XOR mechanism should yield better compression ratios. However, based on experimental observation, it was determined that the byte-wise differential transformation described herein produces data values that have more zeros and small numbers than the data values produced by the bit-wise XOR mechanism, which allows various compression mechanisms to achieve better compression ratios for data that is produced by the byte-wise differential transformation.

Functional Description of an Example Embodiment

Figure 2A:
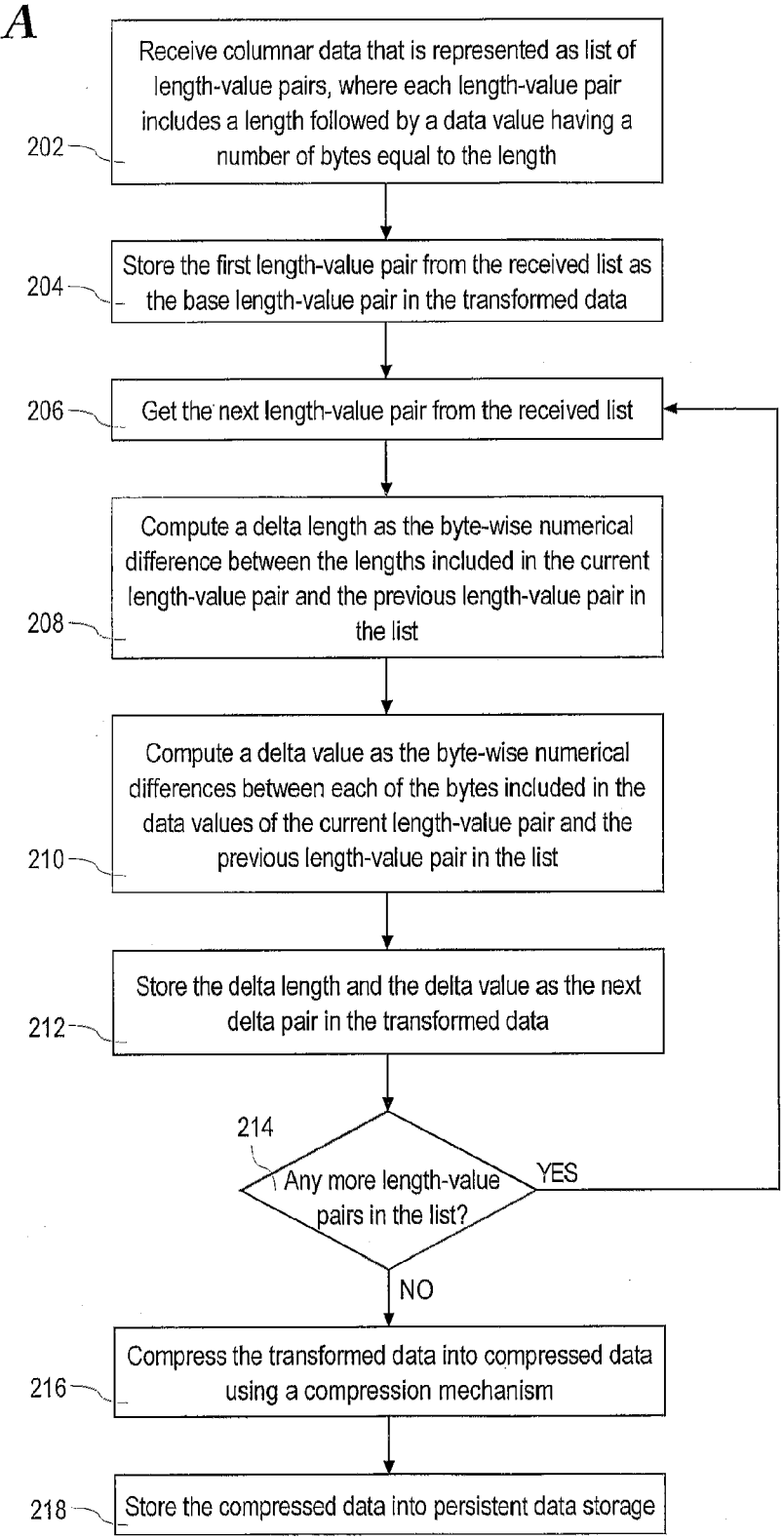
FIG. 2A is a flow diagram that illustrates an example method for performing a byte-wise differential transformation according to one embodiment.

FIG. 2A is a flow diagram that illustrates an example method for performing a byte-wise differential transformation in accordance with the techniques described herein. For illustration purposes, the method in FIG. 2A is described hereinafter as being performed by a storage server or a component thereof (e.g., such as transformation logic 124 in FIG. 1.) It is noted, however, that the method illustrated in FIG. 2A is not limited to being performed by a storage server; rather, the method illustrated in FIG. 2A can be performed by computer process entities other than a storage server including, but not limited to, database servers, application servers, standalone programs, and various client-side and client-server data processing applications.

Referring to FIG. 2A, in step 202 a storage server or a component thereof receives columnar data. As used herein, "columnar data" refers to data that is formatted according to a column-major format. In a column-major format, data values from the same single column in different rows of a given table are stored as a sequence one after the other. Thus, the column-major format is different from a row-major format, in which data values from different columns of the same row of a given table are stored as a sequence one after the other.

The columnar data received by the storage server is represented as a list (e.g., such as an ordered sequence) of length-value pairs. A length-value pair includes one or more bytes that store a length and that are followed a number of bytes, equal to the length, that store a data value. For example, using a hexadecimal notation, the following length-value pair LV-pair_A: "030AC821"

includes a length equal to "3" (as indicated in the first byte of "03") and a 3-byte data value as indicated by the remaining bytes "0A", "C8", and "21". It is noted that the byte-wise differential transformation described herein does not depend on the datatype of the data being represented by the length-value pairs. Thus, in some embodiments, the byte-wise differential transformation may be applied to length-value pairs that represent numbers according to number formats that make use of an exponent to indicate the place of the decimal point in the numbers. For example, in a 100-based decimal format, the following length-value pair LV-pair_B: "0402072348"

includes a length equal to "4" (as indicated in the first byte of "04"), an exponent equal to "2" (as indicated in the second byte of "02", which means that the decimal point is located before the last two digits from the right), and a data value as indicated by the remaining bytes "07", "23", and "48", thereby indicating that the decimal number represented in LV-pair_B is "723.48".

In step 204, the storage server or the component thereof stores the first length-value pair from the received list as the base length-value pair in the transformed data. As used herein, "transformed data" refers to a set of data that is obtained by applying a data transformation technique to a set of original data; thus, with respect to the method illustrated FIG. 2A, the transformed data would be the data obtained by applying the byte-wise differential transformation to the original columnar data that is represented as a list of length-value pairs.

In step 206, the storage server or the component thereof retrieves or otherwise obtains the next length-value pair from the received list, and sets this length-value pair as the current pair.

Then, in step 208 the storage server or the component thereof computes a delta length as the byte-wise numerical difference between the bytes comprising the length included in the current length value pair and the corresponding bytes that comprise the length included in the previous length-value pair in the list. For example, the storage server or the component thereof can compute the delta length by subtracting, byte-wise, the length in the previous length-value pair from the length in the current length-value pair.

In step 210, the storage server or the component thereof computes a delta value as the byte-wise numerical difference between the bytes comprising the data value in the current length value pair and the corresponding bytes that comprise the data value in the previous length-value pair in the list. For example, the storage server or the component thereof can compute the delta value by subtracting, byte-by-byte, the data value in the previous length-value pair from the data value in the current length-value pair.

In step 212, the storage server or the component thereof stores the delta length and the delta value as the next delta pair in the transformed data, and in step 214 determines whether the originally received list includes any more length-value pairs. If the list includes more length-value pairs, the storage server or the component thereof proceeds to step 206 to retrieve the next length-value pair from the list and thereafter performs steps 208 and 210 for that pair. In this manner, the transformed data generated by the storage server or the component thereof includes a list that comprises the first (base) length-value pair from the original list followed by a list of the computed delta pairs; it is noted that the list stored in the transformed data has the same number of pairs as the original list that represents the received columnar data.

If in step 214 the storage server or the component thereof determines that there are no more length-value pairs left in the original list to be processed, the storage server or the component thereof proceeds with step 216. In step 216, the transformed data is passed to a compression/decompression component (e.g., such as compression/decompression logic 126 in FIG. 1) that applies one or more compression mechanisms to the transformed data, thereby compressing the transformed data into compressed data. (As used herein, "compressed data" refers to data that has been compressed by using one or more compression mechanisms.)

Referring back to FIG. 2A, in step 218 the storage server or a component thereof stores the compressed data into persistent data storage. As used herein, "persistent data storage" refers to non-volatile storage media that can store data in various suitable data structures. For example, with respect to the operational context illustrated in FIG. 1, in step 218 of FIG. 2A the compressed data is inserted into in one or more compression units, the headers of the compression units are initialized with metadata information that describes the compression data stored in the compression units (including information indicating that the byte-wise differential transformation was applied and any other relevant information), and the one or more compression units are then stored on one or more persistent storage devices.

In this manner, the byte-wise differential transformation described herein is used to transform columnar data prior to storing the columnar data into persistent data storage. Since the byte-wise differential transformation involves computing differences on a byte-by-byte basis, applying this transformation on the original columnar data produces a substantial number of zeros and small numbers which compress better under the subsequently-applied compression mechanism(s). This results in a better compression ratio than the compression ration that could be achieved by merely compressing the original columnar data, thereby reducing the storage space that is used on the persistent data storage.

Further, the byte-wise differential transformation described herein operates on bytes without regard to the datatype of the data represented by these bytes. Thus, the byte-wise differential transformation is datatype-agnostic and works equally well on bytes that represent numbers and on bytes that represent other type of data such as characters, strings, and dates.

In response to requests to access the stored compressed data, the data is retrieved from the persistent storage, and is then decompressed to obtain the transformed data. Thereafter, a reverse transformation is applied to the transformed data to obtain the original columnar data.

For example, with respect to the example operational context illustrated in FIG. 1, a storage server or a component thereof retrieves a compression unit from a persistent storage device, and then retrieves the compressed data and the associated metadata information from the compression unit. Based on the metadata information, the storage server or the component thereof determines which one or more decompression mechanisms should be applied to decompress the compressed data, and then passes the compressed data to a component (e.g., such as compression/decompression logic 126 in FIG. 1). The decompression component then applies the one or more decompression mechanisms to the compressed data in order to obtain the transformed data. After obtaining the transformed data, according to the techniques described herein the storage server or a component thereof (e.g., such as transformation logic 124 in FIG. 1) applies a reverse transformation to the transformed data to obtain the original data.

When a byte-wise differential transformation was applied to generate the transformed data prior to storing it on persistent storage, the storage server or the component thereof applies to transformed data a reverse byte-wise transformation to generate the original columnar data in the following manner. First, the base (first) length-value pair from the transformed data is stored as the first length-value pair in the computed list of length-value pairs that will comprise the re-generated columnar data. Then, for each delta pair in the list of delta pairs in the transformed data, a length-value pair is computed and stored in the computed list of the re-generated columnar data. The length-value value pair is computed in the following manner: first, a length is computed as the byte-wise numerical addition of the delta length included in the current delta pair and the length in the length-value pair that was computed and stored in the computed list immediately prior (if the current delta pair is the first delta pair in the list in the transformed data, then the length of the base length-value pair is used in the byte-wise addition); then, a data value is computed as the byte-wise numerical addition of the delta value included in the current delta pair and the data value in the length-value pair that was computed and stored in the computed list immediately prior (if the current delta pair is the first delta pair in the list in the transformed data, then the data value of the base length-value pair is used in the byte-wise addition). When all delta pairs from the list in the transformed data are processed in this manner, the original columnar data is re-generated from the transformed data and is represented by the computed list of length-value pairs.

After the original columnar data is re-generated, the storage server or a component thereof may return the re-generated columnar data to the database server and/or may perform any filtering operations on the re-generated data if requested by the database server.

Structural Description of an Example Embodiment

Figure 2B:
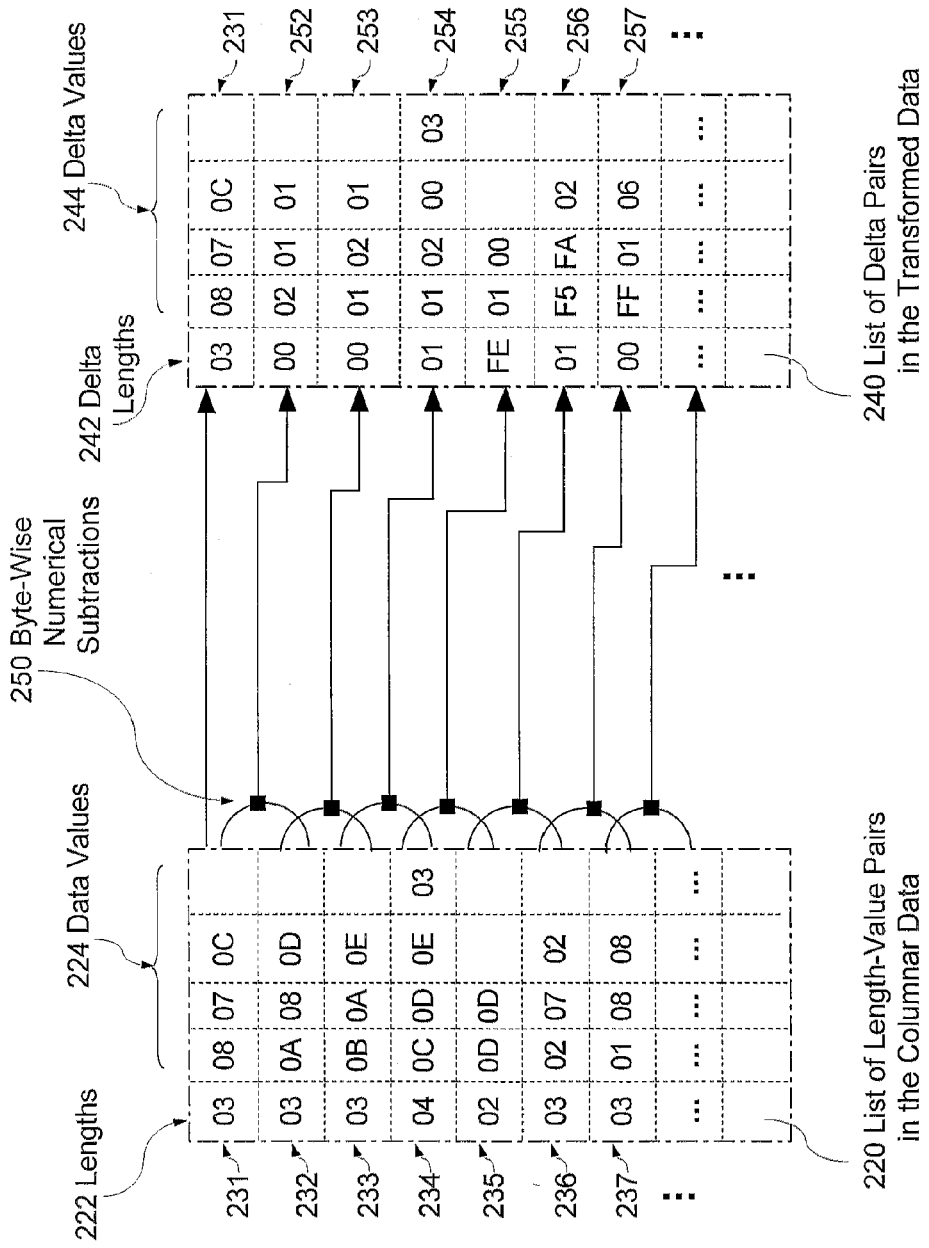
FIG. 2B is a block diagram that illustrates an example byte-wise differential transformation according to one embodiment.

FIG. 2B is a block diagram that illustrates an example byte-wise differential transformation according to one embodiment. List 220 includes a sequence of length-value pairs that represent the columnar data that is to be processed. The length-value pairs in list 220 include one byte for storing lengths 222 and several bytes for storing data values 224. (It is noted that the values in the bytes comprising list 220 are expressed in hexadecimal notation.)

For illustration purposes only, the length-value pairs in lists 220 are depicted as a column. In practice however, the length-value pairs in list 220 are stored as a sequence of bytes without any gaps—that is, the bytes comprising the data value in one length-value pair are immediately followed by the byte comprising the length of the next length-value pair. For example, in a practical implementation of list 220, the last byte ("0C") of pair 231 is followed by the first byte ("03") that indicates the length included in pair 232, which is the next pair in list 220.

According to the byte-wise differential transformation described herein, a series of byte-wise numerical subtractions 250 are applied to list 220 in order to generate list 240 that represents the transformed data. Similar to list 220, the pairs in list 240 include one byte for storing delta lengths 242 and several bytes for storing delta values 244. Further, for illustration purposes only, the delta pairs in list 240 are depicted as a column. However, similarly to list 220, the delta pairs in list 240 are stored as a sequence of bytes without any gaps. For example, in a practical implementation of list 240, the last byte ("01") of pair 252 is followed by the first byte ("00") that indicates the delta length included in pair 253, which is the next pair in list 240. (It is noted that the values in the bytes comprising list 240 are also expressed in hexadecimal notation.)

List 240 includes the first length-value pair 231 (from list 220) followed by a sequence of delta pairs that are produced by subtractions 250. List 240 is generated in the following way. First, length-value pair 231 (which positionally is the first pair in list 220) is copied into list 240 to serve as the base pair in the transformed data. Next, pair 231 is byte-wise subtracted from the next pair 232 in list 220, and the result is stored as delta pair 252 in list 240. Specifically, the first byte ("03") in pair 231 is subtracted from the first byte ("03") in pair 232, and the result "00" is stored as the first byte in pair 252. Next, the second byte ("08") in pair 231 is subtracted from the second byte ("0A") in pair 232, and the result "02" is stored as the second byte in pair 252. Next, the third byte ("07") in pair 231 is subtracted from the third byte ("08") in pair 232, and the result "01" is stored as the third byte in pair 252. Finally, the fourth byte ("0C") in pair 231 is subtracted from the fourth byte ("0D") in pair 232, and the result "01" is stored as the fourth byte in pair 252. (It is noted that the byte-wise subtraction of the first bytes from pairs 231 and 232 produces the delta length 242 in pair 252, and the byte-wise subtraction of the remaining bytes from pairs 231 and 232 produces the delta value 244 in pair 252.)

The remaining length-value pairs in list 220 are processed in a similar manner to generate the remaining delta pairs in list 240. Specifically, pair 232 is byte-wise subtracted from the next pair 233 in list 220, and the result is stored as delta pair 253 in list 240. Pair 233 is byte-wise subtracted from the next pair 234 in list 220, and the result is stored as delta pair 254 in list 240. Pair 234 is byte-wise subtracted from the next pair 235 in list 220, and the result is stored as delta pair 255 in list 240. Pair 235 is byte-wise subtracted from the next pair 236 in list 220, and the result is stored as delta pair 256 in list 240. Pair 236 is byte-wise subtracted from the next pair 237 in list 220, and the result is stored as delta pair 257 in list 240. This process continues until all length-value pairs in list 220 have been processed in this manner and the entire list 240 has been generated. After list 240 is generated, list 240 may further be compressed and then stored on persistent data storage, while the original columnar data in the form of list 220 is discarded.

It is noted that the byte-wise differential transformation produces list 240 to have exactly the same number of entries as the original list 220. It is also noted that in the example of FIG. 2B, the length-value pairs in list 220 represent values from the same column in consecutive table rows, which increases the likelihood that these values are similar (in length as well as content) to each other. Thus, the use of byte-wise subtractions to perform the byte-wise differential transformation results in delta pairs in list 240 that represent a substantial number of zeros and small numbers, which compress a lot better (e.g., achieve a higher compression ratio) when compressed by using one or more compression mechanisms. Because of this, the data in list 240 would take less storage space on persistent storage than the storage space that would be necessary for storing the original list 220. On the other hand, since the byte-wise subtraction operations are arithmetic operations that are typically processed very efficiently by the processor(s) in a computing device, the generation of the transformed data in the form of list 240 requires only a small increase in the usage of computing resources. Thus, the byte-wise differential transformation described herein achieves a very good compression/performance balance because it saves a lot of storage space while at the same time incurs only a marginal decrease in computing performance.

Reverse Byte-Wise Transformation

Figure 2C:
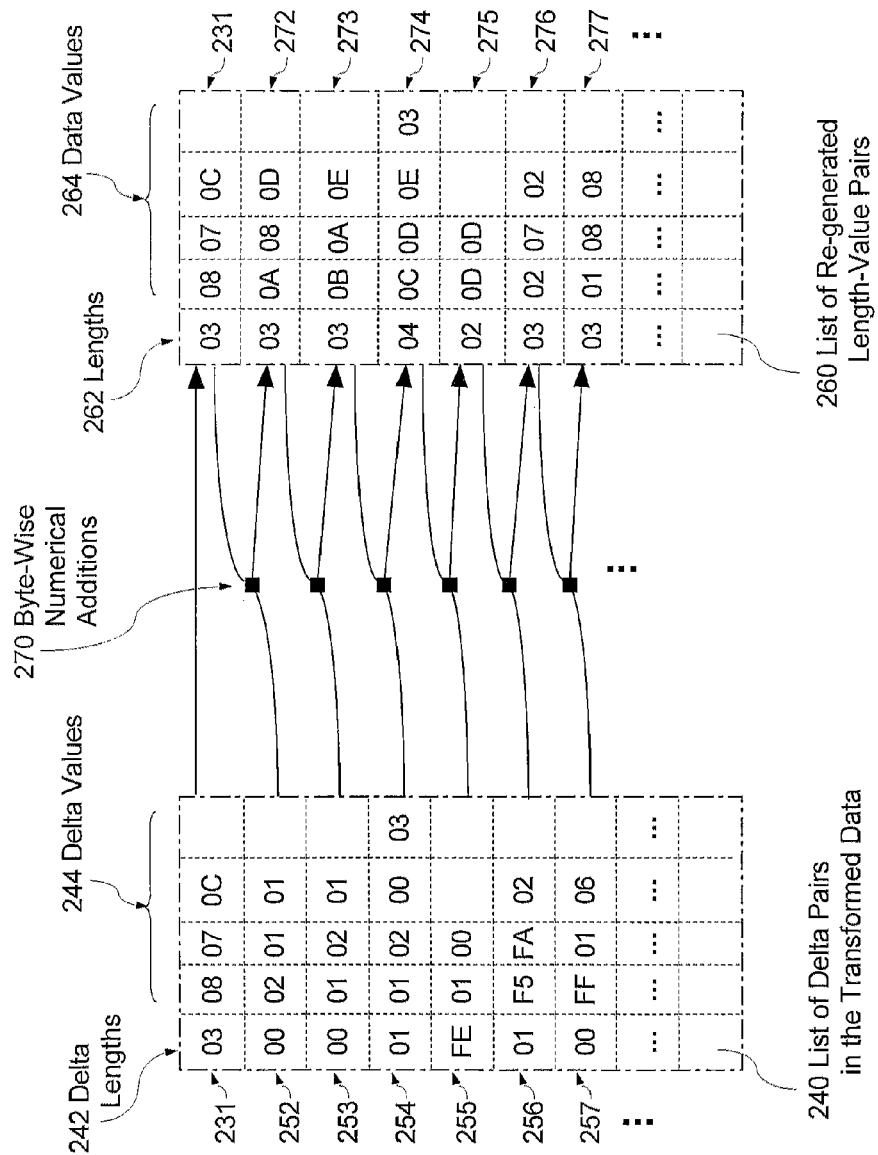
FIG. 2C is a block diagram that illustrates an example of a reverse byte-wise transformation according to one embodiment.

FIG. 2C is a block diagram that illustrates an example of a reverse byte-wise transformation according to one embodiment. The reverse byte-wise transformation involves applying a series of byte-wise numerical additions 270 to re-generate list 260 from list 240, which represents transformed data that was previously generated by the byte-wise differential transformation illustrated in FIG. 2B. It is noted that similar to list 240, the pairs in list 260 include one byte for storing re-generated lengths 262 and several bytes for storing re-generated data values 264. Further, for illustration purposes only, the length-value pairs in list 260 are depicted as a column. However, similarly to list 240, in practice the length-value pairs in list 260 are stored as a sequence of bytes without any gaps.

List 260 includes the first pair 231 (from list 240) followed by a sequence of length-value pairs that are produced by additions 270. Further, since the byte-wise differential transformation illustrated in FIG. 2B is lossless, the reverse byte-wise transformation illustrated in FIG. 2C produces list 260 that is identical to the original list 220 (from which transformed list 240 was generated).

List 260 is generated in the following way. First, base pair 231 (which positionally is the first pair in list 240) is copied into list 260 to serve as the base pair in the re-generated data. Next, pair 231 is byte-wise added to the next pair in list 240 (which is delta pair 252), and the result is stored as length-value pair 272 in list 260. Specifically, the first byte ("03") in pair 231 is added to the first byte ("00") in delta pair 252, and the result "03" is stored as the first byte in pair 272. Next, the second byte ("08") in pair 231 is added to the second byte ("02") in delta pair 252, and the result "0A" is stored as the second byte in pair 272. Next, the third byte ("07") in pair 231 is added to the third byte ("01") in delta pair 252, and the result "08" is stored as the third byte in pair 272. Finally, the fourth byte ("0C") in pair 231 is added to the fourth byte ("01") in delta pair 252, and the result "0D" is stored as the fourth byte in pair 272. In this manner, the reverse byte-wise transformation produces length-value pair 272 to be identical to the second length-value pair 232 on the original list 220 illustrated in FIG. 2B. (It is noted that the byte-wise addition of the first bytes from pair 231 and delta pair 252 produces the length 262 in pair 272, and the byte-wise addition of the remaining bytes from pairs 231 and 252 produces the data value 244 in pair 272.)

The remaining length-value pairs in list 240 are processed in a similar manner to generate the remaining length-value pairs in list 260. Specifically, the computed pair 272 is byte-wise added to the next delta pair 253 in list 240, and the result is stored as length-value pair 273 in list 260. The computed pair 273 is byte-wise added to the next delta pair 254 in list 240, and the result is stored as length-value pair 274 in list 260. The computed pair 274 is byte-wise added to the next delta pair 255 in list 240, and the result is stored as length-value pair 275 in list 260. The computed pair 275 is byte-wise added to the next delta pair 256 in list 240, and the result is stored as length-value pair 276 in list 260. The computed pair 276 is byte-wise added to the next delta pair 257 in list 240, and the result is stored as length-value pair 277 in list 260. This process continues until all delta pairs in list 240 have been processed in this way and the entire list 260 has been generated. In this manner, the length-value pairs in the original columnar data are re-generated because list 260 is identical to the original list 220.

It is noted that since the byte-wise addition operations used in the reverse byte-wise transformation are arithmetic operations that are typically processed very efficiently by the processor(s) in a computing device, the re-generation of the original columnar data in the form of list 260 requires only a small increase in the usage of computing resources.

Processing Length-Value Pairs of Differing Lengths

The byte-wise differential transformation described herein is well-suited for transforming data values that have differing lengths. Using arithmetic terminology, a numerical difference is the result obtained by subtracting a subtrahend from a minuend; for example:

300 (minuend)−200 (subtrahend)=100 (difference).

With respect to this terminology, the byte-wise differential transformation described herein may encounter the following operational cases when transforming data values that have differing lengths.

Minuend has more bytes than subtrahend. In this operational case, the length-value pair from which the subtraction is carried out has more bytes than the length-value pair being subtracted. In this case, the byte-wise differential transformation provides for copying the one or more additional bytes from the longer length-value pair (from which the subtraction is carried out) into the resulting delta pair. This ensures that the byte-wise differential transformation is lossless because the reverse byte-wise transformation can compute the original length-value pair that has the longer length.

An example of this operational case is illustrated in FIG. 2B. Referring to list 220, length-value pair 233 (which has a total of 4 bytes) is subtracted from length-value pair 234 (which has a total of 5 bytes), to obtain delta pair 254. Specifically, when the byte-by-byte subtraction is carried out, a determination is made that length-value pair 233 has 4 bytes and that length-value pair 234 has 5 bytes, and in response thereto the fifth byte ("03") from length-value pair 234 is copied as the fifth byte into the resulting delta pair 254.

The reverse byte-wise transformation to obtain the original length-value pair 234 is illustrated in FIG. 2C. The computed pair 273 (which is identical to original pair 233) is byte-wise added to delta pair 254 to obtain the original length-value pair 234. Specifically, when the byte-by-byte addition is carried out, a determination is made that computed pair 273 has 4 bytes and that delta pair 254 has 5 bytes, and in response thereto the fifth byte ("03") in delta pair 254 is copied as the fifth byte into length-value pair 274 that is being computed. In this manner, the re-generated length-value pair 274 is computed to be identical to the original length-value pair 234.

Minuend has less bytes than subtrahend. In this operational case, the length-value pair from which the subtraction is carried out has less bytes than the length-value pair being subtracted. In this case, the byte-wise differential transformation provides for discarding (e.g., by not storing or forgoing storing in the resulting delta pair) the one or more additional bytes from the longer length-value pair (which is being subtracted). This saves storage space and in addition ensures that the byte-wise differential transformation is lossless because the reverse byte-wise transformation can still compute the correct original length-value pairs.

An example of this case is illustrated in FIG. 2B. Referring to list 220, length-value pair 234 (which has a total of 5 bytes) is subtracted from length-value pair 235 (which has a total of 3 bytes), to obtain delta pair 255. Specifically, when the byte-by-byte subtraction is carried out, a determination is made that length-value pair 235 has 3 bytes and that length-value pair 234 has 5 bytes, and in response thereto the fourth byte ("0E") and the fifth byte ("03") from length-value pair 234 are discarded and are not copied into the resulting delta pair 255.

The reverse transformation to obtain the original length-value pair 235 is illustrated in FIG. 2C. The computed pair 274 (which is identical to original pair 234 and thus has a total of 5 bytes) is byte-wise added to delta pair 255 to obtain the original length-value pair 235. Specifically, when the byte-by-byte addition is carried out, a determination is made that computed pair 274 has 5 bytes and that delta pair 255 has 3 bytes, and in response thereto the fourth byte ("0E") and the fifth byte ("03") in computed pair 274 are disregarded during the addition. In this manner, the re-generated length-value pair 275 is computed to have only 3 bytes and to be identical to the original length-value pair 235.

The reverse transformation to obtain the original length-value pair 234 was described above, and it does not use delta pair 255. Thus, the byte-wise differential transformation and its corresponding reverse byte-wise transformation provide for re-generating both of the original length-value pairs 234 and 235 in a lossless manner.

Processing of Negative Numerical Differences

The byte-wise differential transformation described herein may encounter an operational case in which the byte-by-byte subtraction yields a negative value. This can happen when a byte storing the subtraction minuend has a smaller numerical value than the byte storing the subtraction subtrahend; for example, using hexadecimal notation, the following subtraction yields a negative difference:

"02"(decimal "2")–"8D"(decimal "141")="FF75"
(decimal "–131").

In this example, the minuend and the subtrahend are both one byte, but since the difference is negative it is represented as two bytes, where the extra byte "FF" indicates that the difference has a negative sign.

To address this operational case, when the subtraction between two bytes yields a negative difference, the byte-wise differential transformation provides for storing in the corresponding delta pair an overflow value that is equal to the lowest-order byte in the computed negative difference; the higher-order bytes resulting from the subtraction are discarded. Correspondingly, when the reverse byte-wise transformation performs an addition of two bytes where one of the bytes is an overflow value, the reverse byte-wise transformation keeps the lowest-order byte resulting from the addition and discards the remaining bytes. This ensures that the original bytes can be re-generated in a lossless manner. It is noted that this processing is applied in the same way to bytes that represent the length in a length-value pair as well as to bytes that represent the data value portion of the length-value pair.

An example of this operational case is illustrated in FIGS. 2B and 2C. Referring to list 220 in FIG. 2B, length-value pair 235 is subtracted from length-value pair 236, to obtain delta pair 256. Specifically, when the byte-by-byte subtraction is carried out, the second byte ("0D") in pair 235 is subtracted from the second byte ("02") in pair 236 which results in the negative difference of "FFF5". In response to determining that a negative difference is obtained, the lowest-order byte "F5" from the resulting difference is stored as the second byte in delta pair 256 and the higher-order byte ("FF") is discarded. In a similar manner, when the byte-by-byte subtraction is carried out, the third byte ("0D") in pair 235 is subtracted from the third byte ("07") in pair 236 which results in the negative difference of "FFFA"; in response to determining that a negative difference is obtained, the lowest-order byte "FA" from the resulting difference is stored as the third byte in delta pair 256 and the remaining higher-order byte ("FF") is discarded.

The reverse byte-wise transformation to obtain the original length-value pair 236 is illustrated in FIG. 2C. The computed pair 275 is byte-wise added to delta pair 256 to obtain the original length-value pair 236. Specifically, when the byte-by-byte addition is carried out, the addition of the second byte ("0D") in computed pair 275 is added to the second byte ("F5") in delta pair 256 to yield the sum of "0102". In response to determining that a two-byte sum is obtained, the higher-order byte in the obtained sum ("01") is disregarded and the lower-order byte ("02") is stored as the second byte in length-value pair 276 that is being computed. Similarly, when the byte-by-byte addition is carried out, the addition of the third byte ("0D") in computed pair 275 is added to the third byte ("FA") in delta pair 256 to yield the sum of "0107"; in response to determining that a two-byte sum is obtained, the higher-order byte in the obtained sum ("01") is disregarded and the lower-order byte ("07") is stored as the third byte in length-value pair 276 that is being computed. In this manner, even though the initial byte-wise differential transformation involved a subtraction that yielded a negative difference, the re-generated length-value pair 276 is computed to be identical to the original length-value pair 236.

Length Separation Transformation

The data transformation techniques described herein include a length separation transformation. The length separation transformation is a lossless transformation, which means that the original data can be fully re-generated by applying a reverse transformation to data that has been previously transformed.

The length separation transformation described herein involves transforming length-value pairs by separating the lengths from the data values and storing the lengths separately from the corresponding data values on the persistent data storage. For example, in some embodiments, a set of length-value pairs representing columnar data is transformed into two arrays with corresponding entries: a first array that stores, in a sequence, the lengths from all length-value pairs in the set; and a second array that stores, in the same sequence, the data values from all length-value pairs in the set. For example, if there are 1015 length-value pairs in the set that is to be transformed, then the first array stores 1015 lengths and the second array stores the corresponding 1015 data values.

When applied to columnar data, the length separation transformation is beneficial during a subsequent compression of the transformed data because the lengths are usually very similar in size (e.g., each length may be stored in 1 byte). Since there is little (if any) variation across the byte-sizes of all lengths in the columnar data (e.g., such as data values from the same column in a given table), various compression techniques can be used on the array storing the separated lengths to achieve very high compression ratios (e.g., by using an encoding to encode the lengths, where the encoding entries are smaller in size than the size of the lengths in the array). In addition, for the same reason, separating the data values in a separate array can also result in a better compression than compressing the actual length-value pairs that form the columnar data.

The length separation transformation described herein also results in better performance upon retrieval. This is because when the lengths are stored separately, any given data value (e.g., say the data value in the $51^{st}$ length-value pair in the original data) can be retrieved by computing offsets within the arrays using addition operations that are executed faster than the operations that would otherwise be needed to access the same length-value pair in the original data. For example, such operations to access a particular data value in the original set of length-value pairs would need to retrieve the length of the first length-value pair in the list, add the length to a running sum, jump a number of bytes indicated by the accessed length to determine the location of the length of the next length-value pair in the list, and then repeat the same process until the length and location of the particular data value in the list are determined. In contrast, by separating the lengths and the data values, the length separation technique provides for using only addition operations to compute the location (e.g., offset) of a given data value within the data value array without using any jump operations. In this manner, the length separation transformation described herein saves storage space and also results in very efficient processing upon retrieval and access to the original data.

Functional Description of an Example Embodiment

Figure 3A:
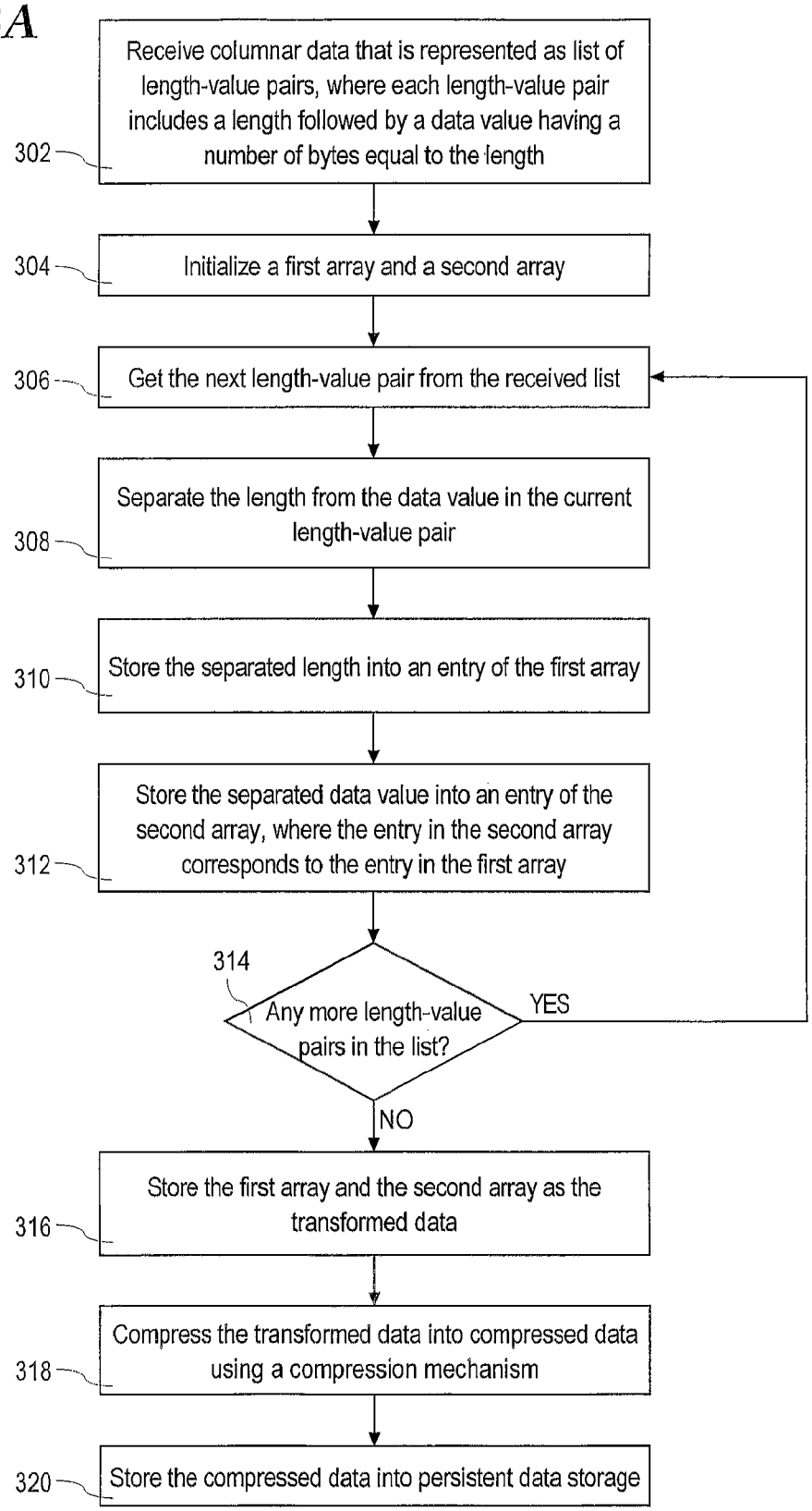
FIG. 3A is a flow diagram that illustrates an example method for performing a length separation transformation according to one embodiment.

FIG. 3A is a flow diagram that illustrates an example method for performing a length separation transformation in accordance with the techniques described herein. For illustration purposes, the method in FIG. 3A is described hereinafter as being performed by a storage server or a component thereof (e.g., such as transformation logic 124 in FIG. 1.) It is noted, however, that the method illustrated in FIG. 3A is not limited to being performed by a storage server; rather, the method illustrated in FIG. 3A can be performed by computer process entities other than a storage server including, but not limited to, database servers, application servers, standalone programs, and various client-side and client-server data processing applications.

Referring to FIG. 3A, in step 302 a storage server or a component thereof receives columnar data that is represented as a list (e.g., such as an ordered sequence) of length-value pairs. Each length-value pair includes one or more bytes that store a length and that are followed a number of bytes, equal to the length, that store a data value.

It is noted that, similarly to the byte-wise differential transformation described herein, the length-separation transformation operates on bytes and thus does not depend on the datatype of the data being represented by the length-value pairs. Thus, in various embodiments, the list of length-value pairs to which the length separation transformation is applied may represent data values that are binary data, numbers, characters, strings, dates/times, etc.

In step 304, the storage server or the component thereof initializes a first array and a second array, where the first array is configured to store the lengths from the length-value pairs and the second array is configured to store the data values from the length-value pairs.

In step 306, the storage server or the component thereof retrieves or otherwise obtains the next length-value pair from the received list, and sets this length-value pair as the current pair.

In step 308 the storage server or the component thereof separates the length from the data value in the current length-value pair. Then, in step 310 the storage server or the component thereof stores the separated length in the next available location in the first array, and in step 312 the storage sever or the component thereof stores the separated data value in the next available location in the second array.

In step 314, the storage server or the component thereof determines whether the originally received list includes any more length-value pairs. If the list includes more length-value pairs, the storage server or the component thereof proceeds to step 306 to retrieve the next length-value pair from the list and thereafter performs steps 308 to 312 for that pair. If in step 314 the storage server or the component thereof determines that there are no more length-value pairs left in the original list to be processed, the storage server or the component thereof proceeds with step 316.

In step 316, the storage server or the component thereof stores the first array and the second array as transformed data. For example, the first and second arrays may be configured as any suitable logical data structures, and the two data structures for the two arrays may be stored or otherwise configured as the transformed data. In some embodiments, after generating the transformed data but prior to compressing it, one or more additional data transformations may be applied to the transformed data in order to achieve better compression in the subsequent compression operation. For example, a byte-wise differential transformation may be applied to the first array that stores the separated lengths, and another byte-wise differential transformation may be applied to the second array that stores the separated data values. If such additional transformations are applied to the already transformed data, then indications of which transformations were applied and the order thereof is stored in the metadata information that is stored with the transformed (and possibly compressed) data on persistent data storage. After the transformed data is generated, the original list of length-value pairs may be discarded.

In step 318, the storage server or the component thereof passes the generated transformed data to a compression component (e.g., such as compression/decompression logic 126 in FIG. 1) that applies one or more compression mechanisms to the transformed data, thereby compressing the transformed data into compressed data. In some embodiments, in order to achieve better compression, the compression/decompression logic may decide to apply one compression mechanism to the first array that stores the separated lengths, and to apply a different compression mechanism to the second array that stores the separated data values; if this is the case, then indications of which compression mechanism(s) were applied to which array will be stored in the metadata information that is stored with the compressed data on persistent data storage.

Referring back to FIG. 3A, in step 320 the storage server or a component thereof stores the compressed data into persistent data storage. In some embodiments, (e.g., such as embodiments implemented in the example operational context illustrated in FIG. 1), in step 320 the compressed data is inserted into one or more compression units, the headers of the compression units are initialized with metadata information that describes the compression data stored in the compression units (including information indicating that the length separation transformation was applied and any other relevant information), and the compression units are then stored on one or more persistent storage devices.

In some embodiments, in the actual storage in a compression unit, the two arrays generated by the length separation transformation may be stored as separate compressed structures within the compression unit. In other embodiments, the compressed structures storing the two arrays may be stored in a single sequence one after the other; in these embodiments, the header of the compression unit would include metadata information that identifies the locations (e.g., offsets) of the two compressed structures within in the sequence.

Reverse Transformation

In response to requests to access the stored data, the compressed data is retrieved from the persistent storage, and is then decompressed to obtain the transformed data. Thereafter, a reverse transformation is applied to the transformed data to obtain the original columnar data.

For example, with respect to the example operational context illustrated in FIG. 1, a storage server or a component thereof retrieves a compression unit from a persistent storage device, and then retrieves the compressed data and the associated metadata information from the compression unit. Based on the metadata information, the storage server or the component thereof determines which one or more decompression mechanisms should be applied to decompress the compressed data, and then passes the compressed data to a component (e.g., such as compression/decompression logic 126 in FIG. 1). The decompression component then applies the one or more decompression mechanisms to the compressed data in order to obtain the transformed data. After obtaining the transformed data, according to the techniques described herein the storage server or a component thereof (e.g., such as transformation logic 124 in FIG. 1) applies a reverse transformation to the transformed data to obtain the original data.

When a length separation transformation was applied to generate the transformed data prior to storing it on persistent storage, the storage server or the component thereof applies to transformed data a reverse transformation to generate the original list of length-value pairs that comprise the original columnar data. Specifically, the storage server or the component thereof retrieves the first array that stores the separated lengths and the second array that stores the separated data values. Then, the storage server or the component thereof retrieves the first length stored in the first array, and thereafter retrieves from the second array the corresponding number of bytes which represent the first data value. The storage server or the component thereof then concatenates the first length and the first data value into a length-value pair, and stores the pair into the re-generated list of length-value pairs. The storage server or the component thereof then repeats this process to retrieve the rest of the lengths from the first array and the corresponding data values from the second array, and to combine them into the rest of the length-value pairs in the re-generated list.

In order to speed up processing, at each iteration the storage server or the component thereof may keep track of the current locations in the first array and in the second array by any suitable mechanism. For example, in some embodiment the storage server or the component thereof may keeping a running sum of the retrieved bytes for each array and may use that sum as the current offset into each array. In another example, in some embodiments the storage server or the component thereof may keep pointers that indicate the location of the next bytes that are to be read from each array, and advance these pointes accordingly when the next length and the next data value are read from the first and the second array, respectively. It is noted, however, that these tracking mechanisms can be implemented by using addition operations, which typically are processed very fast by the processors in a computing device. Because of this, re-generating the original list of length-value pairs from the arrays in the transformed data involves a minimal use of computing resources, which in turns leads to improved retrieval performance.

After the original list of length-value pairs that comprise the columnar data is re-generated, the storage server or a component thereof may return the re-generated columnar data to the database server and/or may perform any filtering operations on the re-generated data if requested by the database server.

Structural Description of an Example Embodiment

Figure 3B:
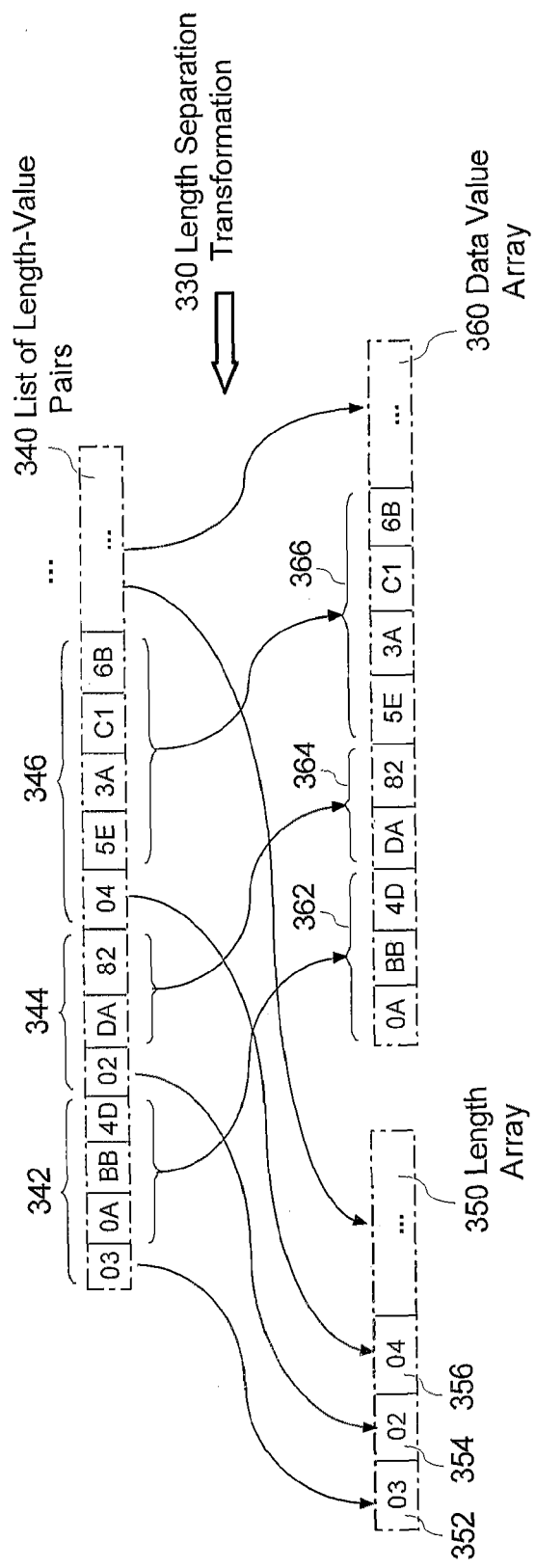
FIG. 3B is a block diagram that illustrates an example length separation transformation according to one embodiment.

FIG. 3B is a block diagram that illustrates an example length separation transformation according to one embodiment. List 340 includes a sequence of length-value pairs that represent the columnar data that is to be processed, where each length-value pair includes one byte for storing a length and several bytes for storing the corresponding data value. The length-value pairs in list 340 are stored as a sequence of bytes without any gaps—that is, the byte(s) comprising the data value in one length-value pair are immediately followed by the byte comprising the length of the next length-value pair. For illustration purposes, the values in the bytes comprising list 340 are expressed in hexadecimal notation.

As illustrated in FIG. 3B, length separation transformation 330 is applied to list 340 to generate length array 350 and data value array 360, where arrays 350 and 360 collectively represent the transformed data into which list 340 is transformed. Array 350 is a sequence bytes in which each length from list 340 is stored as one byte. Array 360 is also a sequence of bytes in which the bytes comprising the data values in list 340 are stored one after the other in a sequence In an example embodiment, when applied to list 340, length separation transformation 330 produces length array 350 and data value array 360 in the following manner. The first length-value pair 342 in list 340 is accessed, and the length byte ("03") is separated from the data value bytes ("0A", "BB", "4D"). Then, the length byte ("03") is stored as the first byte 352 in array 350, and the data value bytes are stored as bytes 362 in array 360. Next, the second length-value pair 344 in list 340 is accessed, and the length byte ("02") is separated from the data value bytes ("DA", "82"). Then, the length byte ("02") is stored as the second byte 354 in array 350, and the data value bytes are stored as bytes 364 after bytes 362. Next, the third length-value pair 346 in list 340 is accessed, and the length byte ("04") is separated from the data value bytes ("5E", "3A", "C1", "6B"). Then, the length byte ("04") is stored as the third byte 356 in array 350, and the data value bytes are stored as bytes 366 after bytes 364. The rest of the length-value pairs in list 340 are processed in the same manner until all length-value pairs in the list are separated and the resulting lengths and data values are stored in length array 350 and data value array 360, respectively. After arrays 350 and 360 generated, the original columnar data in list 340 is discarded.

The component (e.g., such as transformation logic 124 in FIG. 1) that performs length separation transformation 330 keeps track of the current locations in list 340 and arrays 350 and 360 while performing the transformation. For example, the component may keep a location pointer or a current offset for list 340 to indicate the location from which the next byte is going to be read. Similarly, the component may keep a location pointer or a current offset to indicate the location in array 350 in which the next byte is to be stored, and a location pointer or a current offset to indicate the location in array 360 in which the next byte is to be stored. Since such location pointers or offsets can be computed by using addition operations (which typically are processed very fast by the processors in a computing device), performing length separation transformation 330 involves a minimal usage of computing resources.

To re-generate the original list 340, a reverse transformation is applied to length array 350 and data array 360. In an example embodiment, the reverse transformation is performed by traversing arrays 350 and 360, retrieving the lengths from array 350 and the corresponding data values from array 360, and combining the retrieved lengths and the retrieved data values into the length-value pairs in the re-generated list. While performing the reverse transformation, the transformation component (e.g., such as transformation logic 124 in FIG. 1) keeps track of the current locations in the re-generated list and in arrays 350 and 360. Since keeping track of these current locations can be implemented by using addition operations, performing the reverse transformation to re-generate the original list involves a minimal usage of computing resources, which in turn leads to improved retrieval performance.

Native Number Transformation

The data transformation techniques described herein include a native number transformation. The native number transformation is a lossless transformation, which means that the original data can be fully re-generated by applying a reverse transformation to data that has been previously transformed. The native number transformation described herein can be applied to any data values that are formatted according to a format in which the top bit (e.g., such as the left-most or highest-order bit in big-endian computer architectures) in each byte of the data value is "0"—which means that the value stored in each byte is less than "128".

One example of such format is the standard ASCII ("American Standard Code for Information Interchange") set, which is an encoding scheme that maps the values from "0" to "127", which can be stored in a byte, to a specific (printable or non-printable) character.

Another example of such format is a 100-based decimal number format, in which two digits from the range of "0" to "99" are stored in one byte. According to this format, a number value is encoded in the following way: one or more bytes are used to store the length of the number value (in bytes), where the length indicates the sum of the number of bytes in the exponent and the number of bytes that store the actual number; one or more bytes are used to store the value of the exponent, which indicates the place of the decimal point (if any) in the numbers in the actual number; and a list of bytes that store the actual number. According to this format, all of the values stored in the bytes representing a number value (i.e., the bytes representing the length, the exponent, and the actual value) are in the range of "0" to "99", which means that a value stored in any given byte of the number value cannot be greater than "128" and therefore the top-level bit in that byte is "0". For example, in this 100-based decimal number format, the following number value

"0402072348"

includes a length equal to "4" (as indicated in the first byte of "04"), an exponent equal to "2" (as indicated in the second byte of "02", which means that the decimal point is located before the last two digits from the right), and a data value as indicated by the remaining bytes "07", "23", and "48", thereby indicating that the decimal number represented in the number value is "723.48". In another example, the following number value

"03000618"

includes a length equal to "3" (as indicated in the first byte of "03"), an exponent equal to "0" (as indicated in the second byte of "00", which means that the number is an integer that does not include a decimal point), and a data value as indicated by the remaining bytes "06" and "18", thereby indicating that the represented decimal number is the integer "618".

When applied to a set (e.g., such as sequence) of number values, the native number transformation described herein involves marking (setting to "1") the top bit in the last byte of each number value and removing the length from that number value. Since the value stored in any byte of any number value cannot be greater than "127", the length of any number value in the transformed set (or sequence) can be computed on the fly by counting (or computing the sum of) the bytes up to and including next byte in the transformed set (or sequence) that has a value greater than "127". Since determining the next byte that has a value greater than "127" is a simple comparison operation that is executed very fast, and since the location of such next byte can be determined by using mathematical operations on memory addresses (which are also very fast), a computing device can compute the lengths of the number values stored in a transformed set (or sequence) on the fly without expending a lot of computing resources. On the other hand, removing the lengths from the number values in the original set (or sequence) results in significant savings of storage space (e.g., removing one byte from a number value that is four bytes long results in a saving of 25%). In this manner, the native number transformation described herein saves storage space and at the same time transforms the number values in a form that is very efficient to process upon retrieval.

Functional Description of an Example Embodiment

Figure 4A:
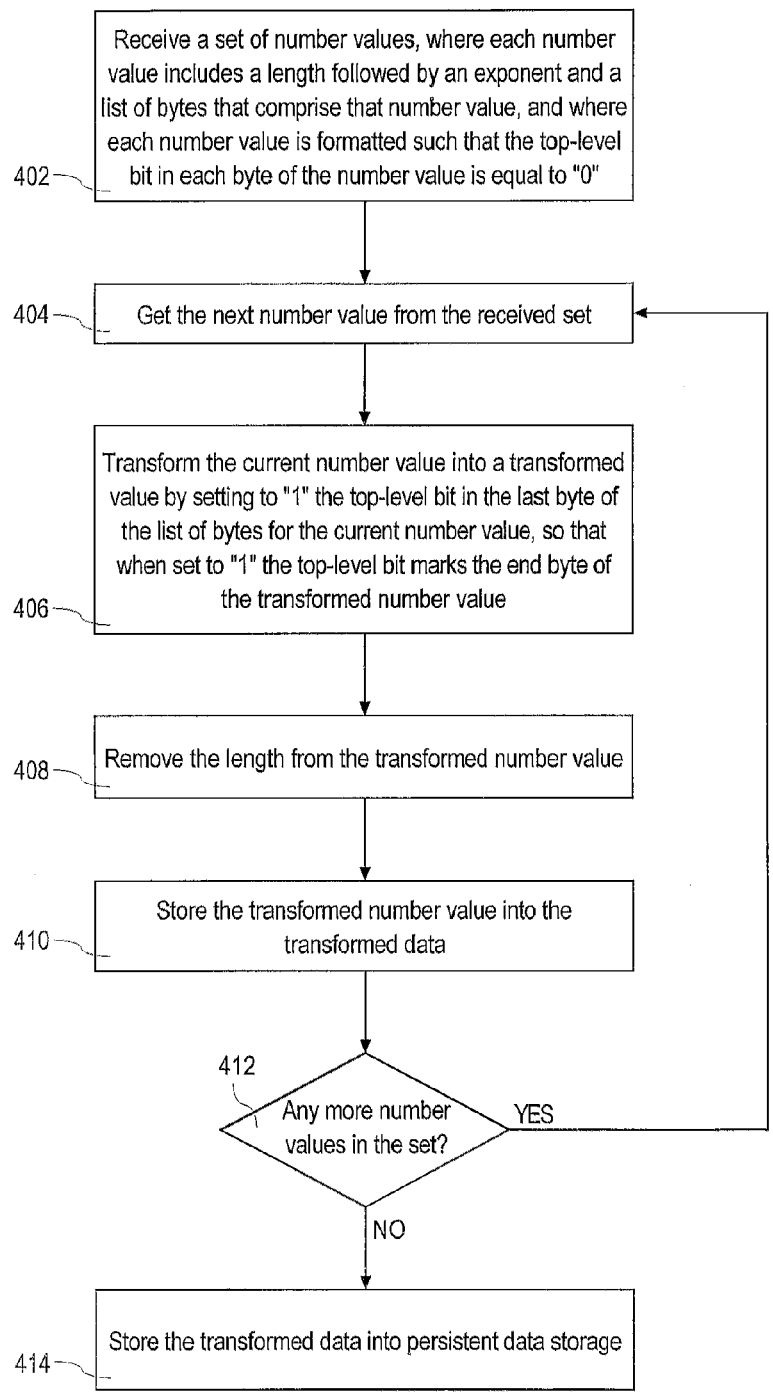
FIG. 4A is a flow diagram that illustrates an example method for performing a native number transformation according to one embodiment.

FIG. 4A is a flow diagram that illustrates an example method for performing a native number transformation in accordance with the techniques described herein. For illustration purposes, the method in FIG. 4A is described hereinafter as being performed by a storage server or a component thereof (e.g., such as transformation logic 124 in FIG. 1.) It is noted, however, that the method illustrated in FIG. 4A is not limited to being performed by a storage server; rather, the method illustrated in FIG. 4A can be performed by computer process entities other than a storage server including, but not limited to, database servers, application servers, standalone programs, and various client-side and client-server data processing applications.

Referring to FIG. 4A, in step 402 a storage server or a component thereof receives a set of number values, where each number value includes a length followed by an exponent and a list (or sequence) of bytes that comprise that number value. The number values in the received set are formatted according to a format in which the top bit in each byte of the number value is "0"—which means that the value stored in each byte is less than "128".

For example, in some embodiments the number values to which the native number transformation is applied may be number values formatted according to the 100-base number format described above. In other embodiments, the set of number values to which the native number transformation is applied constitutes columnar data—for example, the number values may come from the same column across different rows in a table. In yet other embodiments, the set of number values to which the native number transformation is applied may be data values formatted according to the standard ASCII set.

In step 404, the storage server or the component thereof retrieves or otherwise obtains the next number value from the received set, and sets this number value as the current number value that is being processed.

In step 406, the current number value is transformed into a transformed value by setting to "1" the top-level bit in the last byte of the list of bytes included in the current number value. For example, based on the length included in the current number value, the storage server or the component thereof locates the last byte of the current number value, and then adds "128" to the value in this last byte to obtain the transformed value. This addition operation effectively marks (or sets) the top-level bit in the last byte to "1". It is noted that different embodiments can use various mathematical operations—such as bit-wise shift operations or XOR operations—in order to mark the top-level bit in the last byte, and what operations are used may depend on the particular implementation and on the processing resources available to perform the transformation. Thus, the method of FIG. 4A is not limited to any particular operation or mechanism to mark the last byte, and any suitable operation or mechanism may be used.

In step 408, the storage server or the component thereof removes the length from the transformed value—for example, by removing from the transformed value those bytes which store the length of the transformed value. Then, in step 410 the storage server or the component thereof stores the transformed value into the set of transformed data.

In step 412, the storage server or the component thereof determines whether the originally received set includes any more number values. If the set includes more number values, the storage server or the component thereof proceeds to step 404 to retrieve the next number value from the set and thereafter performs steps 406 to 412 for that number value. If in step 412 the storage server or the component thereof determines that there are no more number values left in the original set to be processed, the storage server or the component thereof proceeds with step 414.

In step 414, the storage server or the component thereof stores the transformed data into persistent data storage. For example, in some embodiments, (e.g., such as embodiments implemented in the example operational context illustrated in FIG. 1), in step 414 the transformed data is inserted into one or more compression units, the headers of the compression units are initialized with metadata information that describes the transformed data stored in the compression units (including information indicating that the native number transformation was applied and any other relevant information), and the compression units are then stored on one or more persistent storage devices.

In some embodiments, in step 414 the storage server or the component thereof may pass the generated transformed data to a compression component (e.g., such as compression/decompression logic 126 in FIG. 1) that applies one or more compression mechanisms to the transformed data, thereby compressing the transformed data into compressed data. The compressed data is then inserted into one or more compression units, the headers of the compression units are initialized with metadata information that describes the compressed data stored in the compression units (including information indicating that the native number transformation was applied and information that identifies which compression mechanism(s) where applied), and the compression units are then stored on one or more persistent storage devices.

In this manner, the native number transformation described herein saves a significant amount of storage space (by not storing the lengths of the number values) at the relatively low cost that is incurred when the length of each number value is computed on the fly when the number values are retrieved from the persistent storage.

Reverse Transformation

In response to requests to access the original set of number values, the transformed data comprising the set of transformed number values is retrieved from the persistent data storage, and a reverse transformation is applied to obtain the original data.

For example, with respect to the example operational context illustrated in FIG. 1, a storage server may receive a request for the original data from a database server. The storage server or a component thereof (e.g., such as transformation logic 124 in FIG. 1) retrieves a compression unit from a persistent storage device, and then retrieves the transformed data and the associated metadata information from the compression unit. (If the transformed data is stored in the compression unit in compressed form, then the compressed data is retrieved from the compression unit and is decompressed to obtain the transformed data.) Based on the metadata information from the header of the compression unit, the storage server or a component thereof applies a reverse transformation to the transformed data to obtain the original data.

When a native number transformation was applied to generate the transformed data prior to storing it on persistent storage, the storage server or the component thereof applies to the transformed data a reverse transformation to re-generate the original set of number values. Specifically, the storage server or the component thereof retrieves each transformed value from the transformed set and re-generates the corresponding original number value in the following manner. The storage server or the component thereof traverses the bytes that comprise the transformed data to find the next byte in which the top-level bit is set to "1" (for example, by comparing the value in each byte in the transformed data to "127"), and determines that the found byte is the end byte of the current transformed value. The storage server or the component thereof computes the length of the current transformed value by computing the number of bytes up to and including the end byte (e.g., by computing the memory address offset between the found end byte and the previous byte in which the top-level bit was set to "0"). To obtain the original corresponding number value, the storage server or the component thereof sets the top-level bit of the end byte back to "0", and then prepends the computed length to the current transformed value—for example, by appending one or more bytes that store the computed length to the front of the current transformed value. The thusly computed original number value is stored in the re-generated set, and the storage server or the component thereof proceeds with scanning the transformed data for the next "marked" byte in which the top-level bit is set to "1". The storage server or the component thereof processes all bytes in the transformed data in this manner and re-generates, and stores in the re-generated set, all of the original number values. It is noted that this processing is very efficient because it can compute the lengths of the number values on the fly by using addition operations that typically are executed very fast by the processor(s) in a computing device.

After the original set of number values is re-generated, the storage server or a component thereof may return the re-generated number values to the database server and/or may perform any filtering operations on the re-generated data if requested by the database server.

Structural Description of an Example Embodiment

Figure 4B:
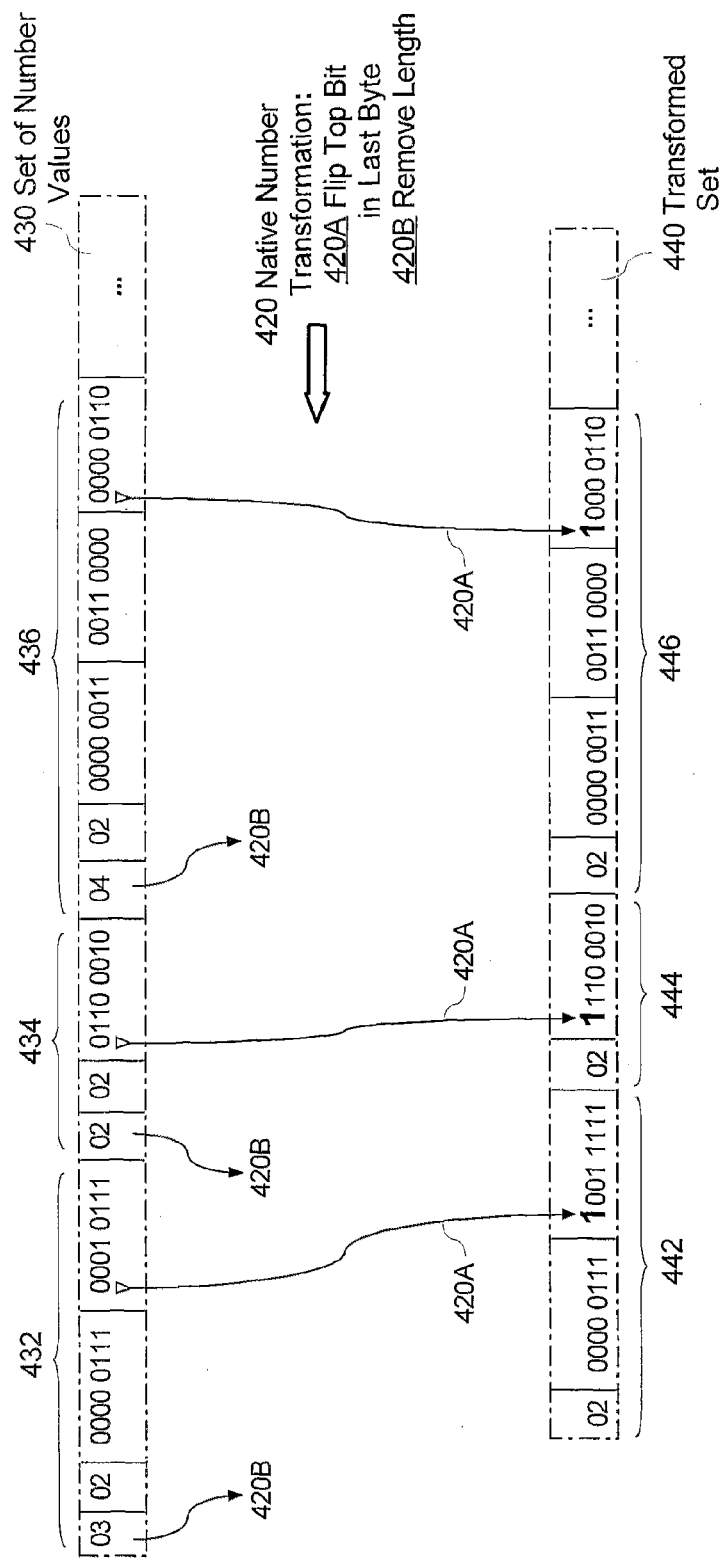
FIG. 4B is a block diagram that illustrates an example native number transformation according to one embodiment.

FIG. 4B is a block diagram that illustrates an example native number transformation according to one embodiment. Set 430 includes a sequence of number values that is to be processed. The number values in set 430 are formatted according to the 100-base number format described heretofore, where each number value includes one byte for storing a length, one byte for storing an exponent, and several bytes for storing the corresponding data value. For illustration purposes, in set 430 the values in the bytes storing the length and the exponent are expressed in hexadecimal notation, and the values in the bytes storing the actual data value are expressed in binary notation.

For example, number value 432 includes one byte ("03") to store the length, one byte ("02") to store the exponent, and two bytes ("00000111", or decimal "7"; and "00010111", or decimal "23") to store the actual data value, thereby indicating that number value 432 stores the decimal number "7.23". Similarly, number value 434 includes one byte ("02") to store the length, one byte ("02") to store the exponent, and one byte ("01100010", or decimal "98") to store the actual data value, thereby indicating that number value 434 stores the decimal number "0.98". Similarly, number value 436 includes one byte ("04") to store the length, one byte ("02") to store the exponent, and three bytes ("00000011", or decimal "3"; "00110000", or decimal "48"; and "00000110", or decimal "6") to store the actual data value, thereby indicating that number value 436 stores the decimal number "348.06"

As illustrated in FIG. 4B, native number transformation 420 is applied to set 430 to generate transformed set 440 that represents the transformed data produced by the transformation. Transformed set 440 is a sequence of bytes that stores the transformed number values, where each number value includes one byte for storing an exponent and several bytes for storing the corresponding data value; it is noted that according to the native number transformation described herein, transformed set 440 does not store the lengths of the transformed number values therein, and the top-level bit in the end byte of each transformed number value is set to "1". In order to illustrated this, in set 440 the values in the bytes storing the exponent are expressed in hexadecimal notation, and the values in the bytes storing the actual data value are expressed in binary notation.

In an example embodiment, when applied to set 430, native number transformation 420 includes operations 420A and 420B. For each number value in set 430, the first operation 420A includes determining the end byte of that number value, and setting the top-level bit the determined end byte to "1". The second operation 420B includes removing the byte storing the length from each number value in set 430, and the resulting transformed value is stored in transformed set 440.

For example, as illustrated in FIG. 4B, when applied to number value 432, operation 420A determines the last byte ("00010111") therein and sets the top-level bit in this byte to "1". Then, operation 420B obtains the transformed value 442 by removing from number value 432 the byte storing the length, and thereafter stores the transformed value 442 in transformed set 440. In the same manner, when applied to number value 434, operations 420A and 420B result in obtaining and storing transformed number value 444 in transformed set 440; and when applied to number value 436, operations 420A and 420B result in obtaining and storing transformed number value 446 in transformed set 440. Operations 420A and 420B are applied in the same manner to all number values in set 430, and the transformed number values comprising transformed set 440 are obtained as a result.

To re-generate the original set 430 (e.g., in response to a request to access the data in this set), a reverse transformation is applied to transformed set 440.

In an example embodiment, the reverse transformation includes traversing the bytes in the transformed set 440, and successively determining the end byte of each transformed value by comparing the value stored in each byte to "127". When the value in a particular byte is greater than "127", this byte is determined as the end byte of the current transformed value; thereafter the top-level bit in this byte is set to "0", the length of the current transformed value is computed (e.g., by computing the offset from the previous end byte or from the begging of transformed set 440 if the current transformed value is the first value in this set), and the corresponding original number value is determined by prepending to the current transformed value one byte that stores the computed length. The determined original number value is then stored in the re-generated set, and the traversal of transformed data 440 continues with determining the end byte of the next transformed value. This process is repeated until the last transformed value is processed and the all the original number values have been determined and stored in the re-generated set.

It is noted that since the reverse transformation can be implemented by using arithmetic operations (e.g., such as comparison operations, addition operations, and multiplication operations), performing the reverse transformation to re-generate the original set of number values involves a minimal usage of computing resources, which in turn leads to improved retrieval performance.

Additional Storage Optimization—Exponent Removal

In some operational cases, all of the number values in the set being transformed may include the same exponent. Such operational case may happen when the set being transformed is columnar data that includes number values from the same column across different rows in a given table. For example, the number values may represent sale prices for purchasing transactions, where the purchasing transactions are stored as rows in a table, and where the sale prices for the transactions are stored in the same column as dollar values having an exponent of "2" (e.g., sale prices such as "$44.13", "$23.59", etc.).

In such operational cases, in order to achieve further savings of persistent storage space, the native number transformation described herein may provide for removing the exponent from the number values in addition to removing the length. Since the exponent is common for all number values in the set, the exponent may be stored once separately from all of the number values, which in turn results in significantly reducing the amount of storage space needed to store the number values. For example, in the example operational context illustrated in FIG. 1, the common exponent may be stored as metadata information in the headers of the compression unit(s) in which the set of number values is stored. In this manner, the common exponent is associated with all of the number values stored in the compression unit, but is being stored only once on the persistent storage.

In some embodiments, in order to be able to remove the common exponent from the number values being transformed, the native number transformation may need to account for a special case. This special case arises when the number values being processed are formatted according to the 100-base number format described herein. In the 100-base number format, the numbers represented in each byte of a number value range from "0" to "99". However, when the exponent is not expressly stored in the number value, an uncertainty arises when the last digit in a transformed number value is between "0" and "9".

To illustrate this special case, consider the following example. In the 100-based number format, the following number value
"03022305"
includes a length equal to "3" (as indicated in the first byte of "03"), an exponent equal to "2" (as indicated in the second byte of "02", which means that the decimal point is located before the last two digits from the right), and a data value as indicated by the remaining bytes "23", and "05", thereby indicating that the decimal number represented in the number value is "23.05". When the native number transformation is applied to the above number value to remove both the length and the exponent, the resulting transformed value should be
"2305"
which includes the two bytes "23" and "05". However, without having the exponent expressly stored in the above transformed value, the last byte "05" can be interpreted as both the decimal value of "5" (if the exponent is "2") and the decimal value of "50" (if the exponent is "1").

To address this situation, the native number transformation described herein provides for an additional encoding to distinguish whether the last byte in a number value stores a value between "0" and "9", or a value between "10" and "99". This additional encoding includes adding the value of "100" to the value in the last byte if the actual value in the last byte is a digit between "0" and "9". Since according to the 100-base number format any byte can only store values ranging from "0" to "99" but cannot store values greater than "100", a transformed value with a last byte having a value between "100" and "109" indicates that the actual value stored in the last byte is a digit between "0" and "9". As a result, when the reverse transformation encounters a transformed value with a last byte having a value of "100", the reverse transformation knows that it needs to subtract "100" from that value to obtain the actual number. It is noted that this additional encoding does not interfere with the transformation operations that remove the length because these operations produce numbers that are greater than "127".

As a practical example, consider the above number value in the 100-base number format:
"03022305"
To transform this number value in accordance with the native number transformation, a component (e.g., such as transformation logic 124 in FIG. 1) first checks whether the last byte stores a digit between "0" and "9". Since the exponent is "2", the component determines that the last byte stores the actual value of "5". The component then performs the additional encoding by adding "100" to the value in the last byte, thereby setting the last byte to the binary value of "01101001" (which is decimal "105"). Then, in order to remove the length from the number value, the component performs the operation to set the top-level bit in the last byte to "1" (which is equivalent to adding "128" to the value of the last byte)—for example, the component flips the top-level bit in the current value ("01101001", decimal "105") of the last byte thereby obtaining the value of "11101001" (which is decimal "233"). Then, the component removes the length and the exponent from the number value, and obtains the 2-byte transformed value of
"17E9" (in hexadecimal notation),
in which the first byte stores hexadecimal "17" (which is decimal "23") and the second byte stores hexadecimal "E9" (which is decimal 233"), and from which the length byte ("03") and the exponent byte ("02") have been removed. (It is noted that the value of the exponent is stored separately from the transformed value, for example in metadata information that is associated with a set of transformed number values that includes the above transformed value.)

In order to generate the original number, the component (e.g., such as transformation logic 124 in FIG. 1) performs the reverse transformation on the transformed value
"17E9" (in hexadecimal notation)
in the following manner. First, the component scans the transformed value to determine the last byte therein, and determines that the byte storing "E9" is greater than "127", which indicates that this byte is the last byte. The component then determines that the transformed number has two bytes ("17" and "E9") and determines from the associated metadata information that the exponent is stored as one byte; thus, the component computes the length of the original number as equal to "3". The component then subtracts the value of "128" from the value ("E9") stored in the last byte, which is equivalent to setting the top-level bit in the current value ("11101001", hexadecimal "E9" and decimal "233") of the last byte to "0", thereby obtaining the value of "011101001" (which is decimal "105"). In order to determine whether the additional encoding was applied to the last byte, the component checks whether the current value of the last byte is greater than "100". Since the current value ("105") in the last byte is greater than "100", the component subtracts "100" from this value, and thus obtains the original value of this byte which is "5". The component then retrieves the exponent ("2") from the metadata information associated with the transformed value, and produces original number value by prepending the current transformed number with one byte which stores the length ("3") and one byte which stores the exponent ("2")—that is, the component obtains the original number value of
"03022305".

In this manner, the native number transformation addresses the special case that arises when a common exponent is removed from a set of number values. It is noted that removing the exponents in addition to removing the lengths from a set of number values results in significant saving of storage space (e.g., removing one length byte and one exponent byte from a number value that is four bytes long results in a saving of two bytes, which is 50% of the storage space otherwise needed to store the number value).

Native Datetime-Type Transformation

The data transformation techniques described herein include a native datetime-type transformation that is suitable for transforming values that have a datetime datatype. The native datetime-type transformation is a lossless transformation, which means that the original data can be fully re-generated by applying a reverse transformation to data that has been previously transformed. The native datetime-type transformation described herein can be applied to datetime values that are formatted according to a format in which each datetime value is comprised of bytes that are organized according to a list of byte positions, where each byte position in the list corresponds to a set of one or more bytes from the datetime value.

An example of such format is the format "YYYYMMD-DHHMMSS". According this format, a datetime value is stored as seven bytes that are ordered according to the following byte positions: the two top (left-most) bytes are used to store the year ("YYYY"), the next byte is used to store the month ("MM"), the next byte is used to store the day in the month ("DD"), the next byte is used to store hour ("HH"), the next byte is used to store the minutes ("MM"), and the last seventh byte is used to store the seconds ("SS"). In this example format, each byte position corresponds to one byte; however, it is noted that in different implementations and embodiments, a byte position can correspond to multiple consecutive bytes.

In some embodiments, the native datetime-type transformation described herein may be applied to datetime values that constitute columnar data—for example, the datetime values may come from the same column across different rows in a table. In these embodiments, most of the datetime values stored in a given column may be clustered around certain dates and times and are not distributed over a wide range. For example, if the given column represents the date and time when a row including the column was inserted into a table, then the datetime values in that column across all rows will be very close to each other if the rows were loaded into the table as a batch. In another example, if the given column stores the date of an on-line purchase that is represented as a row in a table that includes the column, then the datetime values in that column across all rows may cluster around certain dates of a holiday season (e.g., such as the dates between Thanksgiving Day and Christmas).

When applied to a set (e.g., such as sequence) of datetime values that exhibit such clustering property, the native datetime-type transformation described herein generates an encoding based on the cardinalities of the distinct values, across the entire set, that are stored in each set of one or more bytes that corresponds to each byte-position, and then encodes each datetime value by combining the corresponding encoding entries according to their byte position. It is noted that such encoding will have relatively few entries because the datetime values in the set do not exhibit great variability from one another, and as a result the values in the one or more bytes across each byte position can be encoded by using relatively few distinct entries. Hence, the entries in the encoding can be stored in fewer bytes than the bytes necessary for storing the original datetime values. In addition, since an encoded value is organized according a fixed list of byte positions, the entries that are combined into the encoded value can be extracted by successively dividing that encoded value. Since division operations are typically executed very fast by the processor(s) in a computing device, decoding an encoded value to generate the original datetime value is very efficient in its use of computing resources. In this manner, the native datetime-type transformation described herein reduces the amount of storage space necessary to store the datetime values and at the same time transforms the datetime values in a form that is very efficient to process upon retrieval.

Functional Description of an Example Embodiment

Figure 5A:
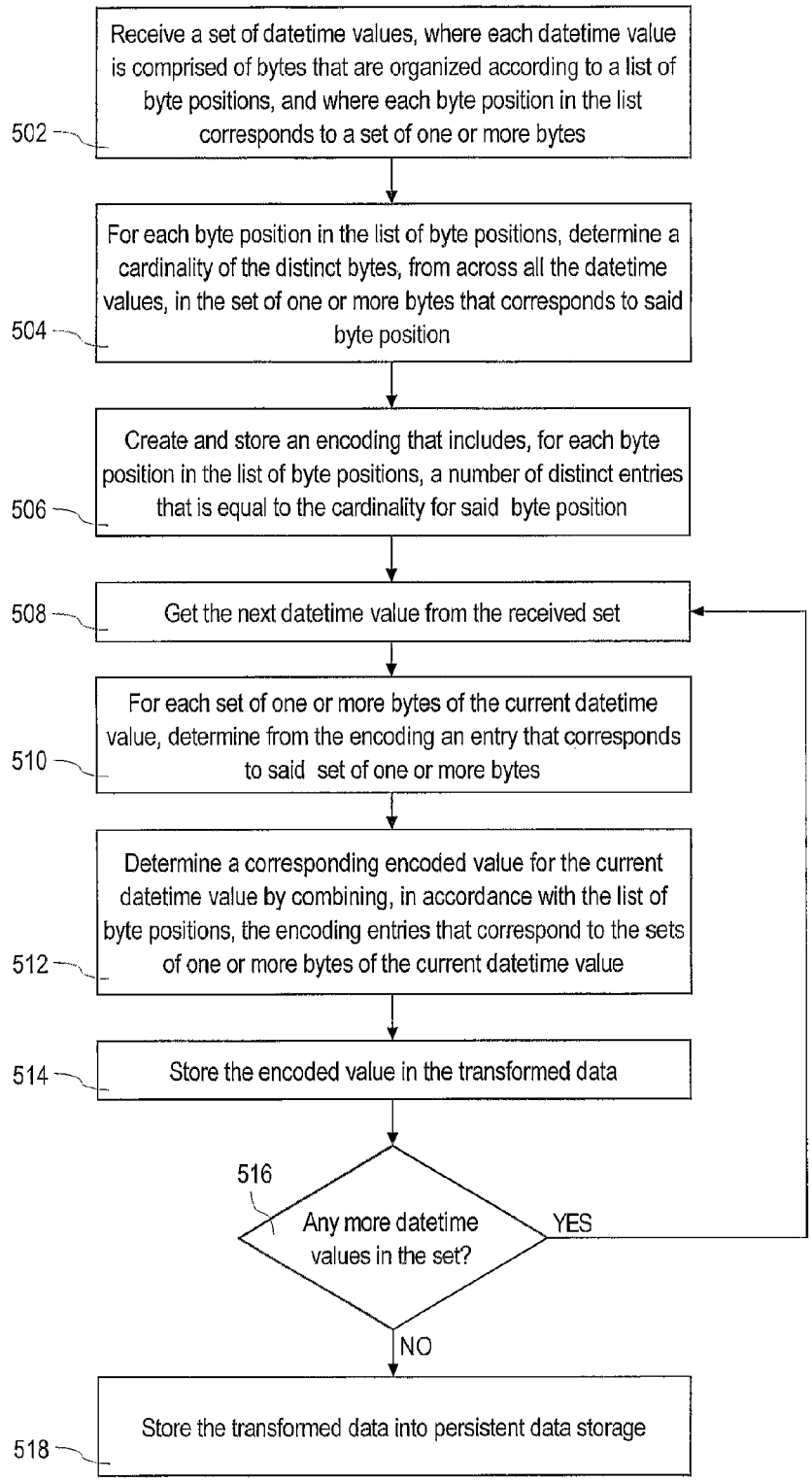
FIG. 5A is a flow diagram that illustrates an example method for performing a native datetime-type transformation according to one embodiment.

FIG. 5A is a flow diagram that illustrates an example method for performing a native datetime-type transformation in accordance with the techniques described herein. For illustration purposes, the method in FIG. 5A is described hereinafter as being performed by a storage server or a component thereof (e.g., such as transformation logic 124 in FIG. 1.) It is noted, however, that the method illustrated in FIG. 5A is not limited to being performed by a storage server; rather, the method illustrated in FIG. 5A can be performed by computer process entities other than a storage server including, but not limited to, database servers, application servers, standalone programs, and various client-side and client-server data processing applications.

Referring to FIG. 5A, in step 502 a storage server or a component thereof receives a set of datetime values, where each datetime value is comprised of bytes that are organized according to a list of byte positions, and where each byte position in the list corresponds to a set of one or more bytes. For example, the datetime values, to which the native datetime-type transformation is applied, may be formatted according to a "YYYYMMDDHHMMSS" format, where the bytes in each position store numbers that are formatted according to a 100-base number format. In some embodiments, the set of datetime values may constitutes columnar data—for example, the datetime values may come from the same column across different rows in a table.

In step 504, the storage server or the component thereof determines a cardinality for each byte position in the list of byte positions. The cardinality for a given byte position is determined as the number of distinct bytes, across all of the datetime values, in the set of one or more bytes that corresponds to this given byte position.

In step 506, the storage server or the component thereof creates and stores an encoding. The total number of entries in the encoding is equal to the product of the cardinalities determined for each byte position (e.g., all the bytes in the set of datetime values can be collapsed into that number of encoding entries), and this number would be relatively small for a set of datetime values that are clustered around a small number of dates and times. The entries in the encoding are associated with, and correspond to, the byte positions according to which the set of datetime values is organized—for example, the number of distinct entries corresponding to a given byte position is equal to the cardinality determined for the values stored in the set of one or more bytes in that byte position across all datetime values in the set.

In step 508, the storage server or the component thereof retrieves or otherwise obtains the next datetime value from the received set, and sets this datetime value as the current datetime value that is being processed.

In step 510, the storage server or the component thereof transforms the current datetime value in the following manner. For each set of one or more bytes in the current datetime value, the storage server or the component thereof determines from the encoding an entry that corresponds to the values stored in that set of one or more bytes, where the determined encoding entry comes from those entries that correspond to the byte position of that set of one or more bytes in the current datetime value.

In step 512, based on the encoding entries determined for each set of one or more bytes in the current datetime value, the storage server or the component thereof determines an encoded value that corresponds to the current datetime value. For example, the storage server or the component thereof may obtain the encoded value by combining (e.g., through operations such as multiplication, concatenation, etc.) the determined entries according to the order of the byte positions of the bytes, from the current datetime value, to which the entries correspond. When obtained in this manner, the encoded value is smaller in size than the current datetime value because the encoding entries are smaller in size than the bytes that they encode.

In step 514, the storage server or the component thereof stores the encoded value into the set of encoded values that comprise the transformed data generated by the native datetime-type transformation.

In step 516, the storage server or the component thereof determines whether the originally received set includes any more datetime values. If the set includes more datetime values, the storage server or the component thereof proceeds to step 508 to retrieve the next number value from the set and thereafter performs steps 510 to 514 for that number value. If in step 516 the storage server or the component thereof determines that there are no more datetime values left in the original set to be processed, the storage server or the component thereof proceeds with step S18.

In step S18, the storage server or the component thereof stores the transformed data into persistent data storage. For example, in some embodiments, (e.g., such as embodiments implemented in the example operational context illustrated in FIG. 1), in step S18 the transformed data is inserted into one or more compression units, the headers of the compression units are initialized with metadata information that describes the transformed data stored in the compression units (including information indicating that the native datetime-type transformation was applied and the encoding that was used to encode the set of datetime values into the transformed data), and the compression units are then stored on one or more persistent storage devices. After the transformed data is generated, the original set of datetime values (from which the transformed data was generated) can be discarded and not stored in the persistent data storage.

In some embodiments, in step S18 the storage server or the component thereof may pass the generated transformed data to a compression component (e.g., such as compression/decompression logic 126 in FIG. 1) that applies one or more compression mechanisms to the transformed data, thereby compressing the transformed data into compressed data. The compressed data is then inserted into one or more compression units, the headers of the compression units are initialized with metadata information that describes the compressed data stored in the compression units (including information indicating that the native datetime-type transformation was applied, the encoding that was used to encode the set of datetime values, and information that identifies which compression mechanism(s) where applied), and the compression units are then stored on one or more persistent storage devices.

In this manner, the native datetime-type transformation described herein saves a significant amount of storage space (by encoding the original datetime values into encoded values that are smaller in size) at the relatively low cost that is incurred when the encoded values are decoded upon retrieval from the persistent storage.

Reverse Transformation

In response to requests to access the original set of datetime values, the transformed data comprising the set of encoded values is retrieved from the persistent data storage, and a reverse transformation is applied to obtain the original data.

For example, with respect to the example operational context illustrated in FIG. 1, a storage server may receive a request for the original data from a database server. The storage server or a component thereof (e.g., such as transformation logic 124 in FIG. 1) retrieves a compression unit from a persistent storage device, and then retrieves the transformed data and the associated metadata information from the compression unit. (If the transformed data is stored in the compression unit in compressed form, then the compressed data is retrieved from the compression unit and is decompressed to obtain the transformed data.) Based on the metadata information from the header of the compression unit, the storage server or a component thereof applies a reverse transformation to the transformed data to obtain the original data.

When a native datetime-type transformation was applied to generate the transformed data prior to storing it on persistent storage, the storage server or the component thereof applies to the transformed data a reverse transformation to re-generate the original set of datetime values. Specifically, the storage server or the component thereof retrieves each encoded value from the transformed data and re-generates the corresponding original datetime value in the following manner. First, the storage server or the component thereof extracts each encoding entry from the encoded value in accordance with the byte position that corresponds to that entry. Different embodiments may implement such entry extraction in various ways, for example, by using different arithmetic operations to operate on the encoded value. Next, the storage server or the component thereof uses the encoding to decode each encoding entry into the corresponding set of one or more bytes of the original datetime value. The storage server or the component thereof then combines (e.g., through operations such as multiplication, concatenation, etc.) the decoded sets of one or more bytes according to the order of their byte positions to obtain the original datetime value.

The storage server or the component thereof processes all encoded values in the transformed data in this manner and re-generates, and stores in the re-generated set, all of the original datetime values. It is noted that this processing is very efficient because it can obtain the original datetime values by using arithmetic operations, which typically are executed very fast by the processor(s) in a computing device.

After the original set of datetime values is re-generated, the storage server or a component thereof may return the re-generated datetime values to the database server and/or may perform any filtering operations on the re-generated data if requested by the database server.

Structural Description of an Example Embodiment

Figure 5B:
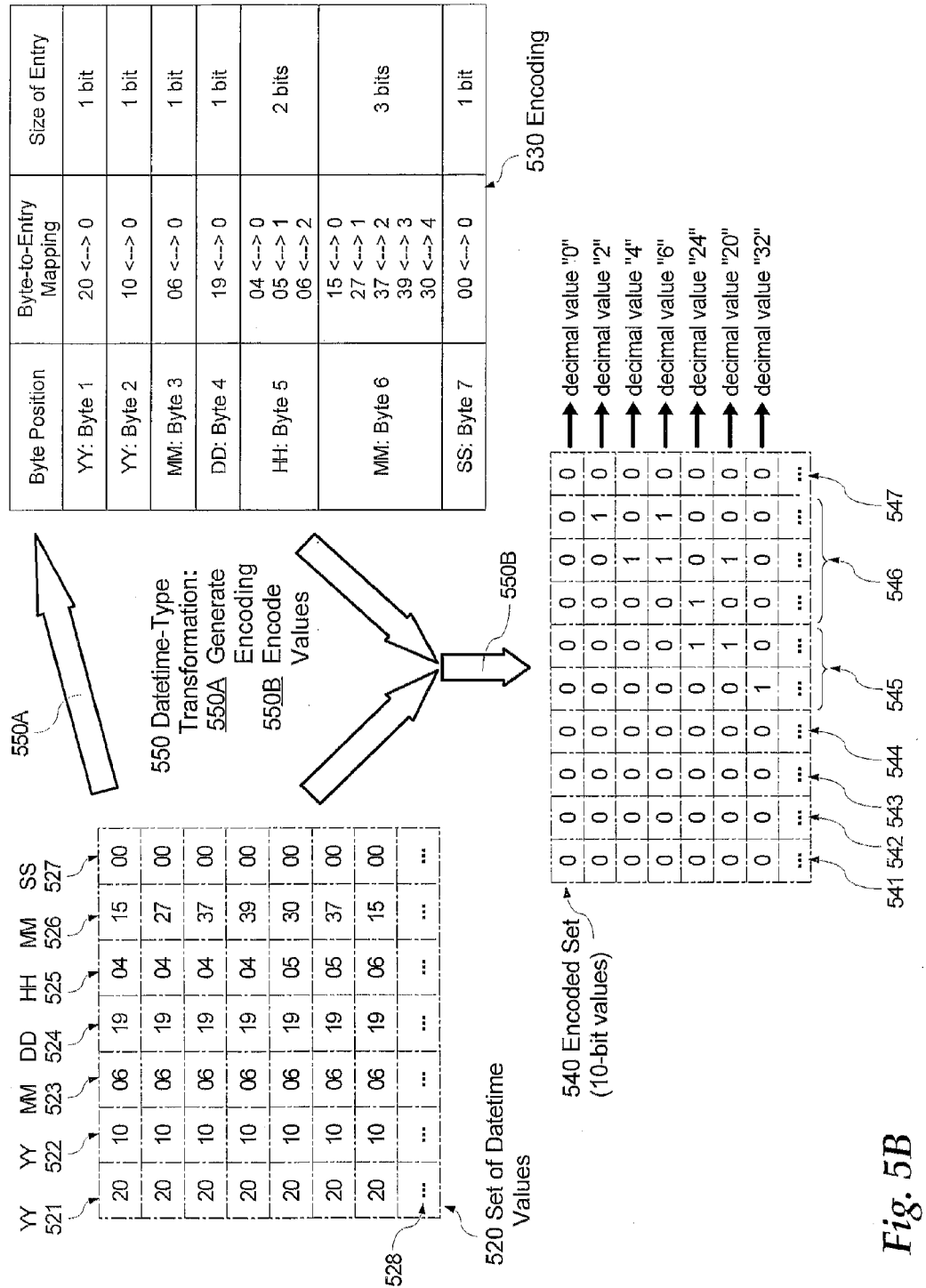
FIG. 5B is a block diagram that illustrates an example native datetime-type transformation according to one embodiment.

FIG. 5B is a block diagram that illustrates an example native datetime-type transformation according to one embodiment. For illustration purposes, the native datetime-type transformation 550 in FIG. 5B uses a bit-based encoding to encode datetime values; however, it is noted that different embodiments may use different encodings to encode datetime values, and for this reason the example datetime-type transformation in FIG. 5B is to be regarded in an illustrative rather than a restrictive sense.

Set 520 includes a set of datetime values that are to be processed. The datetime values in set 520 that are organized according to byte positions 521-527. Byte position 521 ("YY") indicates that one byte is used to store the higher portion of the year of a datetime value, and byte position 522 ("YY") indicates that one byte is used to store the lower portion of the year in that datetime value. Byte position 523 ("MM") indicates that one byte is used to store the month of a datetime value. Byte position 524 ("DD") indicates that one byte is used to store the day of the month in a datetime value. Byte position 525 ("HH") indicates that one byte is used to store the hour in a datetime value. Byte position 526 ("MM") indicates that one byte is used to store the minutes in a datetime value. Finally, byte position 527 ("SS") indicates that one byte is used to store the seconds in a datetime value.

For illustration purposes, in the example embodiment of FIG. 5B each byte position corresponds to one byte in the datetime values. However, it is noted that in different implementations and embodiments, a single byte position can correspond to multiple consecutive bytes. For example, with respect to the "YYYYMMDDHHMMSS" datetime format described above, if the values in the "YYYYMMDD" bytes are the same across all datetime values in the set being processed, then one (e.g., the first) byte position can be assigned to a combination of the four bytes that correspond to the "YYYYMMDD" portion of the datetime format.

In the example embodiment illustrated in FIG. 5B, native datetime-type transformation 550 is applied to set 520 to generate the encoded set 540 that represents the transformed data produced by the transformation. When applied to set 520, native datetime-type transformation 550 includes operations 550A and 550B, which can be performed by a storage server or a component thereof (e.g., such as transformation logic 124 in FIG. 1).

Operation 550A generates encoding 520 that is used to encode the datetime values in set 520 in the following manner. First, operation 550A determines the cardinality for each of byte positions 521-527. For example, operation 550A determines that all bytes in byte position 521 store the same value of "20"; thus operation 550A determines that the cardinality of byte position 521 is "1", and therefore one bit can be used in encoding 530 to encode all bytes of set 520 that correspond to byte position 521. In a similar manner, operation 550A determines that: all bytes in byte position 522 store the same value of "10", and therefore the cardinality of this byte position is also "1" and can be encoded by using one bit in encoding 530; all bytes in byte position 523 store the same value of "06", and therefore the cardinality of this byte position is also "1" and can be encoded by using one bit in encoding 530; and all bytes in byte position 524 store the same value of "19", and therefore the cardinality of this byte position is also "1" and can be encoded by using one bit in encoding 530.

For byte position 525, operation 550A determines that the cardinality of this byte position is "3" because three distinct values ("04", "05", and "06") are stored in the bytes corresponding to this byte position across the entire set 520. (It is assumed that all the rows in set 520 that are indicated by ellipsis 528 store one of the values "04", "05", or "06 in byte position 525.) Thus, operation 550A determines that two bits can be used in encoding 530 to encode all bytes of set 520 that correspond to byte position 525.

In a similar manner, for byte position 526, operation 550A determines that the cardinality of this byte position is "5" because five distinct values ("15", "27", "37", "39", "30") are stored in the bytes corresponding to this byte position across the entire set 520. (It is assumed that all the rows in set 520 that are indicated by ellipsis 528 store one of the values "15", "27", "37", "39", and "30" in byte position 526.) Thus, operation 550A determines that three bits can be used in encoding 530 to encode all bytes of set 520 that correspond to byte position 526.

Finally, for byte position 527, operation 550A determines that all bytes in this byte position store the same value of "00"; thus operation 550A determines that the cardinality of byte position 527 is "1", and therefore one bit can be used in encoding 530 to encode all bytes of set 520 that correspond to byte position 527.

Based on the cardinalities and the distinct values determined for each of byte positions 521-527, operation 550A generates encoding 530. Since encoding 530 is derived only from the datetime values included in set 520, encoding 530 is specific to set 520. This means that the native datetime-type transformation described herein will generate different encoding from a different set of datetime values.

After encoding 530 is generated, the storage server or the component thereof can store encoding 530 on persistent data storage in association with encoded set 540. For example, with respect to the operational context illustrated in FIG. 1, the storage server or the component thereof may store encoding 530 as metadata information in the header of the one or more compression units in which the transformed data (encoded set 540) produced by transformation 550 is stored.

After encoding 530 is generated, the storage server or the component thereof may use the encoding to transform each datetime value in set 520 into a corresponding encoded value in encoded set 540. Each encoded value in encoded set 540 is ten bits long because the sum of the sizes of the encoding entries corresponding to byte positions 521-527 is "10" (i.e., 1+1+1+1+2+3+1=10). Further, each encoded value in encoded set 540 is organized according to bit positions 541-547 that respectively correspond to byte positions 521-527.

To generate encoded set 540, the storage server or the component thereof applies operation 550B to each of the datetime values stored in set 520. Using the $5^{rd}$ datetime value in set 520, "20100619053000" (which indicates the date/time of "Jun. 19, 2010, 5:30:00 am") as an example, operation 550A first determines from encoding 530 the encoding entry for each byte of this datetime value. In other words, for the first byte "20" in byte position 521, operation 550A determines the corresponding entry as "0". Similarly, operation 550A determines that: for the second byte "10" in byte position 522, the corresponding entry is "0"; for the third byte "06" in byte position 523, the corresponding entry is "0"; for the fourth byte "19" in byte position 524, the corresponding entry is "0"; for the fifth byte "05" in byte position 525, the corresponding entry is "1"; for the sixth byte "30" in byte position 526, the corresponding entry is "4"; and for the seventh byte "00" in byte position 527, the corresponding entry is "0". Thus, operation 550B determines that the encoding entries {0, 0, 0, 0, 1, 4, 0} correspond to the above datetime value. Operation 550B then combines these entries according to bit positions 541-547 (e.g., by performing a multiplication operation) to obtain the following encoded value EV_A: "0000011000" (which is decimal "24"), where the bit in position 541 stores "0", the bit in position 542 stores "0", the bit in position 543 stores "0", the bit in position "544" stores "0", the two bits in position 545 store "01" (which is decimal "1" and is the encoding entry for this bit position), the three bits in position 546 store "100" (which is decimal "4" and is the encoding entry for this bit position), and the bit in position 547 stores "0".

Operation 550B is applied to each of the datetime values in set 520 in the same manner, and the resulting encoded values are stored in encoded set 540. Since the datetime values in the original set are not distributed over a wide range of dates and times, the encoded values in set 540 are not only smaller in size than the original datetime value, but also include a lot of zeros and small numbers which generally yield better compression ratios when compressed with various compression mechanisms. (As illustrated in FIG. 5B, the higher-level bits in each encoded value are all zeros, which causes the encoded values in set 540 to be relatively small integer numbers.)

To re-generate the original set 520 (e.g., in response to a request to access the data in this set), a reverse transformation is applied to transformed set 540. The reverse transformation (not illustrated in FIG. 5B) is applied to each encoded value and involves an extraction operation to extract the encoded entries from the encoded values and a decode operation that uses encoding 530 to generate the corresponding bytes in the original datetime value.

In an example embodiment, the encoding entries can be extracted from a given encoded value by successively dividing the encoded entry (or the result from a previous division) by a divisor that is equal to:

$$2^{Ni}$$

where $N_i$ is the bit-size of the $i^{th}$ entry in the encoding. Using encoded value EV_A: "0000011000" (which is decimal "24")

and encoding 530 in FIG. 5B as an example, the following successive divisions are performed to obtain the original datetime value:

The encoded value "0000011000" is divided by "$2^1$" (which reflects the size of the right-most bit position 547), to obtain the result "000001100" (decimal "12") with a remainder of "0". The remainder "0" is checked against encoding 530 for the last bit position 547, and the original byte of "00" is obtained. The result "000001100" (decimal "12") is used in the next division operation.

The result from the previous division "000001100" (decimal "12") is divided by "$2^3$" (which reflects the size of the bit position 546), to obtain the result "000001" (decimal "1") with a remainder of "100" (decimal "4"). The remainder "4" is checked against encoding 530 for the bit position 546, and the original byte of "30" is obtained. The result "000001" (decimal "1") is used in the next division operation.

The result from the previous division "000001" (decimal "1") is divided by "$2^2$" (which reflects the size of the bit position 545), to obtain the result "0000" (decimal "0") with a remainder of "01" (decimal "1"). The remainder "1" is checked against encoding 530 for the bit position 545, and the original byte of "05" is obtained. The result "0000" (decimal "0") is used in the next division operation.

The result from the previous division "0000" (decimal "0") is divided by "$2^1$" (which reflects the size of the bit position 544), to obtain the result "000" (decimal "0") with a remainder of "0" (decimal "0"). The remainder "0" is checked against encoding 530 for the bit position 544, and the original byte of "19" is obtained. The result "000" (decimal "0") is used in the next division operation.

The result from the previous division "000" (decimal "0") is divided by "$2^1$" (which reflects the size of the bit position 543), to obtain the result "00" (decimal "0") with a remainder of "0" (decimal "0"). The remainder "0" is checked against encoding 530 for the bit position 543, and the original byte of "06" is obtained. The result "00" (decimal "0") is used in the next division operation.

The result from the previous division "00" (decimal "0") is divided by "$2^1$" (which reflects the size of the bit position 542), to obtain the result "0" (decimal "0") with a remainder of "0" (decimal "0"). The remainder "0" is checked against encoding 530 for the bit position 542, and the original byte of "10" is obtained. The result "0" (decimal "0") is used in the next division operation.

The result "0" (decimal "0") is divided by "$2^1$" (which reflects the size of the bit position 541), to obtain the result "0" (decimal "0") with a remainder of "0" (decimal "0"). The remainder "0" is checked against encoding 530 for the bit position 541, and the original byte of "20" is obtained.

In this manner, the original bytes corresponding to encoded value EV_A ("0000011000", decimal "24") are determined. The original bytes are then combined (e.g., by using a multiplication operation) according to the byte positions 521-527 that respectively correspond to bit positions 541-547, and the original datetime value of

"20100619053000"

is obtained.

It is noted that since the above reverse transformation can be implemented by using arithmetic operations (e.g., such as division and multiplication operations), performing the reverse transformation to re-generate the original set of datetime values does not consume a significant usage of computing resources, which in turn leads to improved retrieval performance

HARDWARE OVERVIEW

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 6:
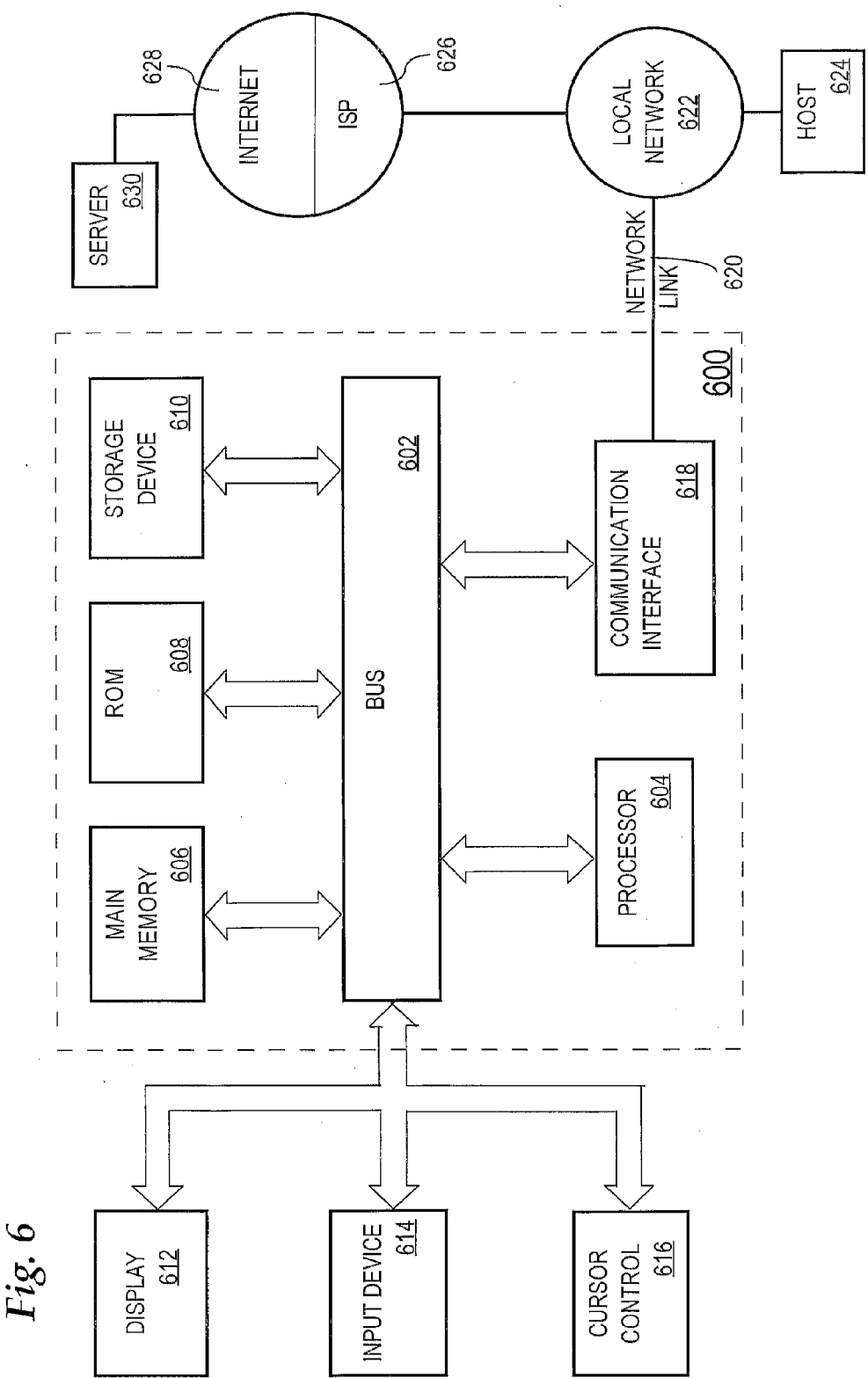
FIG. 6 is a block diagram that illustrates an example computing device on which embodiments may be implemented.

For example, FIG. 6 is a block diagram that illustrates an example computer system 600 upon which an embodiment of the techniques described herein may be implemented. Computer system 600 includes a bus 602 or other communication mechanism for communicating information, and a hardware processor 604 coupled with bus 602 for processing information. Hardware processor 604 may be, for example, a general purpose microprocessor.

Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Such instructions, when stored in non-transitory storage media accessible to processor 604, render computer system 600 into a special-purpose machine that is customized to perform the operations specified in the instructions.

Computer system 600 further includes a read only memory (ROM) 608 or other static storage device coupled to bus 602 for storing static information and instructions for processor 604. A storage device 610, such as a magnetic disk or optical disk, is provided and coupled to bus 602 for storing information and instructions.

Computer system 600 may be coupled via bus 602 to a display 612, such as a cathode ray tube (CRT) or a liquid crystal display (LCD), for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 604 executing one or more sequences of one or more instructions contained in main memory 606. Such instructions may be read into main memory 606 from another storage medium, such as storage device 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 610. Volatile media includes dynamic memory, such as main memory 606. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 602. Transmission media can also take the form of acoustic or light waves, such as those generated during radio-wave and infra-red data communications.

Various forms of media may be involved in carrying one or more sequences of one or more instructions to processor 604 for execution. For example, the instructions may initially be carried on a magnetic disk or solid state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the world wide packet data communication network now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are example forms of transmission media.

Computer system 600 can send messages and receive data, including program code, through the network(s), network link 620 and communication interface 618. In the Internet example, a server 630 might transmit a requested code for an application program through Internet 628, ISP 626, local network 622 and communication interface 618.

The received code may be executed by processor 604 as it is received, and/or stored in storage device 610, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A storage medium storing one or more sequences of instructions which, when executed by one or more processors, cause the one or more processors to perform steps comprising:
   receiving columnar data, wherein the columnar data is represented as a list of length-value pairs, and wherein each length-value pair includes a data value and a length of the data value expressed as a number of bytes;
   for each two consecutive length-value pairs in the list of length-value pairs, computing a delta pair that includes:
      a delta length that is computed as the byte-wise numerical difference between the lengths included in said each two consecutive length-value pairs; and
      a delta value that is computed as the byte-wise numerical difference between the data values included in said each two consecutive length-value pairs;
   transforming the columnar data into transformed data, wherein the transformed data includes a base length-value pair, from the list of length-value pairs, and a list of the computed delta pairs;
   compressing the transformed data into compressed data; and
   storing the compressed data into persistent data storage.

2. The storage medium of claim 1, wherein the one or more sequences of instructions further comprise instructions which, when executed by the one or more processors, cause the one or more processors to perform steps comprising:
  retrieving the compressed data from the persistent data storage;
  decompressing the compressed data into the transformed data;
  for each delta pair in the list of delta pairs in the transformed data, computing a length-value pair that includes:
    a length that is computed as the byte-wise numerical addition of the delta length included in said each delta pair and the length computed for the preceding length-value pair; and
    a data value that is computed as the byte-wise numerical addition of the delta value included in said each delta pair and the data value computed for the preceding length-value pair;
  generating the columnar data by including, as the list of length-value pairs that comprise the columnar data, the base length-value pair from the transformed data and a list of the computed length-value pairs.

3. The storage medium of claim 1, wherein the instructions that cause computing the delta pair further comprise instructions which, when executed by the one or more processors, cause the one or more processors to perform one or more of the steps of:
  when a first data value, from said each two consecutive length-value pairs, is longer than a second data value, from said each two consecutive length-value pairs, by first one or more additional bytes, then storing the first one or more additional bytes as part of the delta value;
  when the second data value, from said each two consecutive length-value pairs, is longer than the first data value, from said each two consecutive length-value pairs, by second one or more additional bytes, then forgoing storing the second one or more additional bytes in the delta value.

4. The storage medium of claim 1, wherein the instructions that cause computing the delta pair further comprise instructions which, when executed by the one or more processors, cause the one or more processors to perform one or more of the steps of:
  when a first length, from particular two consecutive length-value pairs, is numerically smaller than a second length, from said particular two consecutive length-value pairs, then computing the byte-wise numerical difference between the first length and the second length as a first overflow value;
  when a first data value, from said particular two consecutive length-value pairs, is numerically smaller than a second data value, from said particular two consecutive length-value pairs, then computing the byte-wise numerical difference between the first data value and the second data value as a second overflow value.

5. The storage medium of claim 4, wherein the one or more sequences of instructions further comprise instructions which, when executed by the one or more processors, cause the one or more processors to perform:
  after retrieving and decompressing the compressed data back into the transformed data, generating the columnar data, wherein generating the columnar data comprises computing a particular length-value pair, of said particular two consecutive length-value pairs, from a particular delta pair in the list of delta pairs in the transformed data, wherein computing the particular length-value pair comprises:
    when the delta length in the particular delta pair is the first overflow value, then performing a byte-wise numerical addition of the first overflow value and the length computed for the preceding length-value pair, and discarding the higher byte that results from the addition; and
    when the delta value in the particular delta pair is the second overflow value, then performing a byte-wise numerical addition of the second overflow value and the data value computed for the preceding length-value pair, and discarding the higher byte that results from the addition.

6. The storage medium of claim 1, wherein the instructions that cause storing the compressed data into the persistent data storage further comprise instructions which, when executed by the one or more processors, cause the one or more processors to perform storing the compressed data in a compression unit that is stored in the persistent data storage.

7. The storage medium of claim 1, wherein the columnar data includes data values that are one of numbers and characters.

8. A storage medium storing one or more sequences of instructions which, when executed by one or more processors, cause the one or more processors to perform steps comprising:
  receiving columnar data, wherein the columnar data is represented as a list of length-value pairs, and wherein each length-value pair includes a data value and a length of the data value expressed as a number of bytes;
  transforming the columnar data into transformed data by performing steps comprising:
    separating each length-value pair, in the list of length-value pairs, into the length and the data value of said each length-value pair;
    storing the separated lengths as first entries in a first array; and
    storing the separated data values as second entries in a second array;
    wherein the first entries, in the first array, respectively correspond to the second entries in the second array;
  compressing the transformed data into compressed data; and
  storing the compressed data into persistent data storage.

9. The storage medium of claim 8, wherein the one or more sequences of instructions further comprise instructions which, when executed by the one or more processors, cause the one or more processors to perform steps comprising:
  retrieving the compressed data from the persistent data storage;
  decompressing the compressed data into the transformed data; and
  generating the columnar data from the decompressed transformed data, wherein generating the columnar data comprises re-constituting each length-value pair, in the list of length-value pairs, by performing steps comprising:
    retrieving the length of said each length-value pair from a first array entry;
    retrieving the data value of said each length-value pair from a second array entry that corresponds to the first array entry; and
    generating said each length-value pair from the retrieved length and the retrieved data value.

10. The storage medium of claim 8, wherein the instructions that cause storing the compressed data into the persistent data storage further comprise instructions which, when executed by the one or more processors, cause the one or more processors to perform storing the compressed data in a compression unit that is stored in the persistent data storage.

11. The storage medium of claim 8, wherein the columnar data includes data values that are one of numbers and characters.

12. A storage medium storing one or more sequences of instructions which, when executed by one or more processors, cause the one or more processors to perform steps comprising:
receiving a set of number values, wherein each number value is formatted to include:
an exponent of said each number value;
a list of bytes that comprise said each number value, wherein the top-level bit in each byte of the list of bytes is equal to "0"; and
a length that is the sum of the number of bytes in the exponent and the number of bytes in the list of bytes for said each number value;
transforming the set of number values into a transformed set of number values, wherein transforming the set of number values comprises:
for each number value in the set of number values:
transforming said each number value into a corresponding transformed number value by removing the length from said each number value and storing only the exponent and the list of bytes of said each number value; and
setting to "1" the top-level bit in the last byte of the list of bytes that is stored in the corresponding transformed number value;
wherein, when set to "1", the top-level bit indicates the end byte of the corresponding transformed number value; and
storing the transformed set of number values into persistent data storage.

13. The storage medium of claim 12, wherein the one or more sequences of instructions further comprise instructions which, when executed by the one or more processors, cause the one or more processors to perform steps comprising:
retrieving the transformed set of number values from the persistent data storage; and
generating the set of number values from the transformed set of number values that is retrieved from the persistent data storage, wherein generating the set of number values comprises traversing the transformed set of number values and performing the steps of:
determining the end byte of each transformed number value by determining the next byte, in the transformed set of number values, in which the top-level bit is set to "1", wherein such next byte is the end byte of said each transformed number value;
setting to "0" the top-level bit in the end byte of said each transformed number value;
computing the length of said each transformed number value based on the end byte of said each transformed number value;
determining a number value corresponding to said each transformed number value by prepending one or more bytes, which store the computed length, to the front of said each transformed number value; and
storing the determined number values in the generated set of number values.

14. The storage medium of claim 12, wherein:
each number value, in the set of number values, is formatted according to a format in which each byte, from the list of bytes included in said each number value, represents a number ranging from "0" to "99";
the one or more sequences of instructions further comprise instructions which, when executed by the one or more processors, cause the one or more processors to perform the step of determining that each number value in the set of number values has the same exponent; and
the instructions that cause transforming the set of number values further comprise instructions which, when executed by the one or more processors, cause the one or more processors to perform steps comprising:
for each number value, in the set of number values:
transforming said each number value into the corresponding transformed number value by further removing the exponent from said each number value and storing only the list of bytes of said each number value as the corresponding transformed number value; and
if the end byte of the corresponding transformed number value stores a value between "0" and "9", then adding a value of "100" to the end byte, thereby indicating that the end byte represents the value between "0" and "9".

15. The storage medium of claim 12, wherein the set of number values is columnar data.

16. The storage medium of claim 12, wherein each number value, in the set of number values, is formatted according to a format in which each byte, from the list of bytes included in said each number value, represents a number ranging from "0" to "99".

17. The storage medium of claim 12, wherein each number value, in the set of number values, represents a standard ASCII character.

18. The storage medium of claim 12, wherein the instructions that cause storing the transformed set of number values into the persistent data storage further comprise instructions which, when executed by the one or more processors, cause the one or more processors to perform:
compressing the transformed set of number values into compressed data; and
storing the compressed data in a compression unit that is stored on the persistent data storage.

19. A storage medium storing one or more sequences of instructions which, when executed by one or more processors, cause the one or more processors to perform steps comprising:
receiving a set of datetime values, wherein each datetime value in the set of datetime values is comprised of bytes that are organized according to a list of byte positions, wherein each byte position, in the list of byte positions, corresponds to a set of one or more bytes;
transforming the set of datetime values into a set of encoded values, wherein transforming the set of datetime values comprises:
for each byte position in the list of byte positions, determining a cardinality of the distinct bytes, from across all datetime values in the set of datetime values, in the set of one or more bytes that corresponds to said each byte position;
creating and storing an encoding that includes, for each byte position in the list of byte positions, a number of distinct entries that is equal to the cardinality for said each byte position; and transforming each datetime value, in the set of datetime values, into a corresponding encoded value in the set of encoded values by performing the steps of:
for each set of one or more bytes, of said each datetime value, that corresponds to a byte position in the list of byte positions, determining from the encoding an entry that corresponds to the byte position of said each set of one or more bytes; and
determining the corresponding encoded value for said each datetime value by combining, in accordance with the list of byte positions, the encoding entries that correspond to the sets of one or more bytes of said each datetime value; and
storing the set of encoded values into persistent data storage.

20. The storage medium of claim 19, wherein the one or more sequences of instructions further comprise instructions which, when executed by the one or more processors, cause the one or more processors to perform steps comprising:
retrieving the set of encoded values from the persistent data storage; and
generating the set of datetime values from the set of encoded values that is retrieved from the persistent data storage, wherein generating the set of datetime values comprises determining, for each encoded value in the set of encoded values, a corresponding datetime value by performing steps comprising:
extracting each encoding entry from said each encoded value in accordance with the byte position, in the list of byte positions, that corresponds to said each entry; and
determining each set of one or more bytes of the corresponding datetime value by using the encoding to decode the extracted entry that corresponds to said each set of one or more bytes.

21. The storage medium of claim 19, wherein the set of datetime values is columnar data.

22. The storage medium of claim 19, wherein the instructions that cause storing the set of encoded values into the persistent data storage further comprise instructions which, when executed by the one or more processors, cause the one or more processors to perform:
compressing the set of encoded values into compressed data; and
storing the compressed data in a compression unit that is stored on the persistent data storage.

23. A method, comprising steps of:
receiving columnar data, wherein the columnar data is represented as a list of length-value pairs, and wherein each length-value pair includes a data value and a length of the data value expressed as a number of bytes;
for each two consecutive length-value pairs in the list of length-value pairs, computing a delta pair that includes:
a delta length that is computed as the byte-wise numerical difference between the lengths included in said each two consecutive length-value pairs; and
a delta value that is computed as the byte-wise numerical difference between the data values included in said each two consecutive length-value pairs;
transforming the columnar data into transformed data, wherein the transformed data includes a base length-value pair, from the list of length-value pairs, and a list of the computed delta pairs;
compressing the transformed data into compressed data;
storing the compressed data into persistent data storage; and
wherein the steps are performed by one or more computing devices.

24. The method of claim 23, further comprising:
retrieving the compressed data from the persistent data storage;
decompressing the compressed data into the transformed data;
for each delta pair in the list of delta pairs in the transformed data, computing a length-value pair that includes:
a length that is computed as the byte-wise numerical addition of the delta length included in said each delta pair and the length computed for the preceding length-value pair; and
a data value that is computed as the byte-wise numerical addition of the delta value included in said each delta pair and the data value computed for the preceding length-value pair;
generating the columnar data by including, as the list of length-value pairs that comprise the columnar data, the base length-value pair from the transformed data and a list of the computed length-value pairs.

25. The method of claim 23, further comprising:
when a first data value, from said each two consecutive length-value pairs, is longer than a second data value, from said each two consecutive length-value pairs, by first one or more additional bytes, then storing the first one or more additional bytes as part of the delta value;
when the second data value, from said each two consecutive length-value pairs, is longer than the first data value, from said each two consecutive length-value pairs, by second one or more additional bytes, then forgoing storing the second one or more additional bytes in the delta value.

26. The method of claim 23, further comprising:
when a first length, from particular two consecutive length-value pairs, is numerically smaller than a second length, from said particular two consecutive length-value pairs, then computing the byte-wise numerical difference between the first length and the second length as a first overflow value;
when a first data value, from said particular two consecutive length-value pairs, is numerically smaller than a second data value, from said particular two consecutive length-value pairs, then computing the byte-wise numerical difference between the first data value and the second data value as a second overflow value.

27. The method of claim 26, further comprising:
after retrieving and decompressing the compressed data back into the transformed data, generating the columnar data, wherein generating the columnar data comprises computing a particular length-value pair, of said particular two consecutive length-value pairs, from a particular delta pair in the list of delta pairs in the transformed data, wherein computing the particular length-value pair comprises:
when the delta length in the particular delta pair is the first overflow value, then performing a byte-wise numerical addition of the first overflow value and the length computed for the preceding length-value pair, and discarding the higher byte that results from the addition; and
when the delta value in the particular delta pair is the second overflow value, then performing a byte-wise numerical addition of the second overflow value and the data value computed for the preceding length-value pair, and discarding the higher byte that results from the addition.

28. The method of claim 23, wherein storing the compressed data into the persistent data storage further comprises storing the compressed data in a compression unit that is stored in the persistent data storage.

29. The method of claim 23, wherein the columnar data includes data values that are one of numbers and characters.

30. A method comprising steps of:
receiving columnar data, wherein the columnar data is represented as a list of length-value pairs, and wherein each length-value pair includes a data value and a length of the data value expressed as a number of bytes;
transforming the columnar data into transformed data by performing steps comprising:
separating each length-value pair, in the list of length-value pairs, into the length and the data value of said each length-value pair;
storing the separated lengths as first entries in a first array; and
storing the separated data values as second entries in a second array;
wherein the first entries, in the first array, respectively correspond to the second entries in the second array;
compressing the transformed data into compressed data;
storing the compressed data into persistent data storage; and
wherein the steps are performed by one or more computing devices.

31. The method of claim 30, further comprising steps of:
retrieving the compressed data from the persistent data storage;
decompressing the compressed data into the transformed data; and
generating the columnar data from the decompressed transformed data, wherein generating the columnar data comprises re-constituting each length-value pair, in the list of length-value pairs, by performing steps comprising:
retrieving the length of said each length-value pair from a first array entry;
retrieving the data value of said each length-value pair from a second array entry that corresponds to the first array entry; and
generating said each length-value pair from the retrieved length and the retrieved data value.

32. The method of claim 30, wherein storing the compressed data into the persistent data storage further comprises storing the compressed data in a compression unit that is stored in the persistent data storage.

33. The method of claim 30, wherein the columnar data includes data values that are one of numbers and characters.

34. A method comprising steps of:
receiving a set of number values, wherein each number value is formatted to include:
an exponent of said each number value;
a list of bytes that comprise said each number value, wherein the top-level bit in each byte of the list of bytes is equal to "0"; and
a length that is the sum of the number of bytes in the exponent and the number of bytes in the list of bytes for said each number value;
transforming the set of number values into a transformed set of number values, wherein transforming the set of number values comprises:
for each number value in the set of number values:
transforming said each number value into a corresponding transformed number value by removing the length from said each number value and storing only the exponent and the list of bytes of said each number value; and
setting to "23" the top-level bit in the last byte of the list of bytes that is stored in the corresponding transformed number value;
wherein, when set to "23", the top-level bit indicates the end byte of the corresponding transformed number value;
storing the transformed set of number values into persistent data storage; and
wherein the steps are performed by one or more computing devices.

35. The method of claim 34, further comprising steps:
retrieving the transformed set of number values from the persistent data storage; and
generating the set of number values from the transformed set of number values that is retrieved from the persistent data storage, wherein generating the set of number values comprises traversing the transformed set of number values and performing the steps of:
determining the end byte of each transformed number value by determining the next byte, in the transformed set of number values, in which the top-level bit is set to "23", wherein such next byte is the end byte of said each transformed number value;
setting to "0" the top-level bit in the end byte of said each transformed number value;
computing the length of said each transformed number value based on the end byte of said each transformed number value;
determining a number value corresponding to said each transformed number value by prepending one or more bytes, which store the computed length, to the front of said each transformed number value; and
storing the determined number values in the generated set of number values.

36. The method of claim 34, wherein:
each number value, in the set of number values, is formatted according to a format in which each byte, from the list of bytes included in said each number value, represents a number ranging from "0" to "99";
the method further comprises the step of determining that each number value in the set of number values has the same exponent; and
transforming the set of number values further comprises steps of:
for each number value, in the set of number values:
transforming said each number value into the corresponding transformed number value by further removing the exponent from said each number value and storing only the list of bytes of said each number value as the corresponding transformed number value; and
if the end byte of the corresponding transformed number value stores a value between "0" and "31", then adding a value of "100" to the end byte, thereby indicating that the end byte represents the value between "0" and "31".

37. The method of claim 34, wherein the set of number values is columnar data.

38. The method of claim 34, wherein each number value, in the set of number values, is formatted according to a format in which each byte, from the list of bytes included in said each number value, represents a number ranging from "0" to "99".

39. The method of claim 34, wherein each number value, in the set of number values, represents a standard ASCII character.

40. The method of claim 34, wherein storing the transformed set of number values into the persistent data storage further comprises steps of:
compressing the transformed set of number values into compressed data; and
storing the compressed data in a compression unit that is stored on the persistent data storage.

41. A method, the method comprising steps of:
receiving a set of datetime values, wherein each datetime value in the set of datetime values is comprised of bytes that are organized according to a list of byte positions, wherein each byte position, in the list of byte positions, corresponds to a set of one or more bytes;
transforming the set of datetime values into a set of encoded values, wherein transforming the set of datetime values comprises:
for each byte position in the list of byte positions, determining a cardinality of the distinct bytes, from across all datetime values in the set of datetime values, in the set of one or more bytes that corresponds to said each byte position;
creating and storing an encoding that includes, for each byte position in the list of byte positions, a number of distinct entries that is equal to the cardinality for said each byte position; and
transforming each datetime value, in the set of datetime values, into a corresponding encoded value in the set of encoded values by performing the steps of:
for each set of one or more bytes, of said each datetime value, that corresponds to a byte position in the list of byte positions, determining from the encoding an entry that corresponds to the byte position of said each set of one or more bytes; and
determining the corresponding encoded value for said each datetime value by combining, in accordance with the list of byte positions, the encoding entries that correspond to the sets of one or more bytes of said each datetime value;
storing the set of encoded values into persistent data storage; and
wherein the steps are performed by one or more computing devices.

42. The method of claim 41, further comprising steps of:
retrieving the set of encoded values from the persistent data storage; and
generating the set of datetime values from the set of encoded values that is retrieved from the persistent data storage, wherein generating the set of datetime values comprises determining, for each encoded value in the set of encoded values, a corresponding datetime value by performing steps comprising:
extracting each encoding entry from said each encoded value in accordance with the byte position, in the list of byte positions, that corresponds to said each entry; and
determining each set of one or more bytes of the corresponding datetime value by using the encoding to decode the extracted entry that corresponds to said each set of one or more bytes.

43. The method of claim 41, wherein the set of datetime values is columnar data.

44. The method of claim 41, wherein storing the set of encoded values into the persistent data storage further comprises steps of:
compressing the set of encoded values into compressed data; and
storing the compressed data in a compression unit that is stored on the persistent data storage.

45. A computer system, comprising:
at least one processor;
a memory coupled to said processor;
said computer system configured to perform steps of:
receiving columnar data, wherein the columnar data is represented as a list of length-value pairs, and wherein each length-value pair includes a data value and a length of the data value expressed as a number of bytes;
for each two consecutive length-value pairs in the list of length-value pairs, computing a delta pair that includes:
a delta length that is computed as the byte-wise numerical difference between the lengths included in said each two consecutive length-value pairs; and
a delta value that is computed as the byte-wise numerical difference between the data values included in said each two consecutive length-value pairs;
transforming the columnar data into transformed data, wherein the transformed data includes a base length-value pair, from the list of length-value pairs, and a list of the computed delta pairs;
compressing the transformed data into compressed data;
storing the compressed data into persistent data storage.

46. The computer system of claim 45, further comprising:
retrieving the compressed data from the persistent data storage;
decompressing the compressed data into the transformed data;
for each delta pair in the list of delta pairs in the transformed data, computing a length-value pair that includes:
a length that is computed as the byte-wise numerical addition of the delta length included in said each delta pair and the length computed for the preceding length-value pair; and
a data value that is computed as the byte-wise numerical addition of the delta value included in said each delta pair and the data value computed for the preceding length-value pair;
generating the columnar data by including, as the list of length-value pairs that comprise the columnar data, the base length-value pair from the transformed data and a list of the computed length-value pairs.

47. The computer system of claim 45, further comprising:
when a first data value, from said each two consecutive length-value pairs, is longer than a second data value, from said each two consecutive length-value pairs, by first one or more additional bytes, then storing the first one or more additional bytes as part of the delta value;
when the second data value, from said each two consecutive length-value pairs, is longer than the first data value, from said each two consecutive length-value pairs, by second one or more additional bytes, then forgoing storing the second one or more additional bytes in the delta value.

48. The computer system of claim 45, further comprising:
when a first length, from particular two consecutive length-value pairs, is numerically smaller than a second length, from said particular two consecutive length-value pairs, then computing the byte-wise numerical difference between the first length and the second length as a first overflow value;

when a first data value, from said particular two consecutive length-value pairs, is numerically smaller than a second data value, from said particular two consecutive length-value pairs, then computing the byte-wise numerical difference between the first data value and the second data value as a second overflow value.

49. The computer system of claim 48, further comprising: after retrieving and decompressing the compressed data back into the transformed data, generating the columnar data, wherein generating the columnar data comprises computing a particular length-value pair, of said particular two consecutive length-value pairs, from a particular delta pair in the list of delta pairs in the transformed data, wherein computing the particular length-value pair comprises:

when the delta length in the particular delta pair is the first overflow value, then performing a byte-wise numerical addition of the first overflow value and the length computed for the preceding length-value pair, and discarding the higher byte that results from the addition; and when the delta value in the particular delta pair is the second overflow value, then performing a byte-wise numerical addition of the second overflow value and the data value computed for the preceding length-value pair, and discarding the higher byte that results from the addition.

50. The computer system of claim 45, wherein storing the compressed data into the persistent data storage further comprises storing the compressed data in a compression unit that is stored in the persistent data storage.

51. The computer system of claim 45, wherein the columnar data includes data values that are one of numbers and characters.

52. A computer system, comprising:
at least one processor;
a memory coupled to said processor;
said computer system configured to perform steps of:
receiving columnar data, wherein the columnar data is represented as a list of length-value pairs, and wherein each length-value pair includes a data value and a length of the data value expressed as a number of bytes;
transforming the columnar data into transformed data by performing steps comprising:
separating each length-value pair, in the list of length-value pairs, into the length and the data value of said each length-value pair;
storing the separated lengths as first entries in a first array; and
storing the separated data values as second entries in a second array;
wherein the first entries, in the first array, respectively correspond to the second entries in the second array;
compressing the transformed data into compressed data;
storing the compressed data into persistent data storage; and
wherein the steps are performed by one or more computing devices.

53. The computer system of claim 52, further comprising steps of:
retrieving the compressed data from the persistent data storage;
decompressing the compressed data into the transformed data; and generating the columnar data from the decompressed transformed data, wherein generating the columnar data comprises re-constituting each length-value pair, in the list of length-value pairs, by performing steps comprising:
retrieving the length of said each length-value pair from a first array entry;
retrieving the data value of said each length-value pair from a second array entry that corresponds to the first array entry; and
generating said each length-value pair from the retrieved length and the retrieved data value.

54. The computer system of claim 52, wherein storing the compressed data into the persistent data storage further comprises storing the compressed data in a compression unit that is stored in the persistent data storage.

55. The computer system of claim 52, wherein the columnar data includes data values that are one of numbers and characters.

56. A computer system, comprising:
at least one processor;
a memory coupled to said processor;
said computer system configured to perform steps of:
receiving a set of number values, wherein each number value is formatted to include:
an exponent of said each number value;
a list of bytes that comprise said each number value, wherein the top-level bit in each byte of the list of bytes is equal to "0"; and
a length that is the sum of the number of bytes in the exponent and the number of bytes in the list of bytes for said each number value;
transforming the set of number values into a transformed set of number values, wherein transforming the set of number values comprises:
for each number value in the set of number values:
transforming said each number value into a corresponding transformed number value by removing the length from said each number value and storing only the exponent and the list of bytes of said each number value; and
setting to "45" the top-level bit in the last byte of the list of bytes that is stored in the corresponding transformed number value;
wherein, when set to "45", the top-level bit indicates the end byte of the corresponding transformed number value;
storing the transformed set of number values into persistent data storage; and
wherein the steps are performed by one or more computing devices.

57. The computer system of claim 56, further comprising steps:
retrieving the transformed set of number values from the persistent data storage; and
generating the set of number values from the transformed set of number values that is retrieved from the persistent data storage, wherein generating the set of number values comprises traversing the transformed set of number values and performing the steps of:
determining the end byte of each transformed number value by determining the next byte, in the transformed set of number values, in which the top-level bit is set to "45", wherein such next byte is the end byte of said each transformed number value;
setting to "0" the top-level bit in the end byte of said each transformed number value;

computing the length of said each transformed number value based on the end byte of said each transformed number value;

determining a number value corresponding to said each transformed number value by prepending one or more bytes, which store the computed length, to the front of said each transformed number value; and storing the determined number values in the generated set of number values.

58. The computer system of claim 56, wherein:

each number value, in the set of number values, is formatted according to a format in which each byte, from the list of bytes included in said each number value, represents a number ranging from "0" to "99";

the computer system further comprises the step of determining that each number value in the set of number values has the same exponent; and transforming the set of number values further comprises steps of:

for each number value, in the set of number values:

transforming said each number value into the corresponding transformed number value by further removing the exponent from said each number value and storing only the list of bytes of said each number value as the corresponding transformed number value; and if the end byte of the corresponding transformed number value stores a value between "0" and "53", then adding a value of "100" to the end byte, thereby indicating that the end byte represents the value between "0" and "53".

59. The computer system of claim 56, wherein the set of number values is columnar data.

60. The computer system of claim 56, wherein each number value, in the set of number values, is formatted according to a format in which each byte, from the list of bytes included in said each number value, represents a number ranging from "0" to "99".

61. The computer system of claim 56, wherein each number value, in the set of number values, represents a standard ASCII character.

62. The computer system of claim 56, wherein storing the transformed set of number values into the persistent data storage further comprises steps of:

compressing the transformed set of number values into compressed data; and storing the compressed data in a compression unit that is stored on the persistent data storage.

63. A computer system, comprising:

at least one processor;

a memory coupled to said processor;

said computer system configured to perform steps of:

receiving a set of datetime values, wherein each datetime value in the set of datetime values is comprised of bytes that are organized according to a list of byte positions, wherein each byte position, in the list of byte positions, corresponds to a set of one or more bytes;

transforming the set of datetime values into a set of encoded values, wherein transforming the set of datetime values comprises:

for each byte position in the list of byte positions, determining a cardinality of the distinct bytes, from across all datetime values in the set of datetime values, in the set of one or more bytes that corresponds to said each byte position;

creating and storing an encoding that includes, for each byte position in the list of byte positions, a number of distinct entries that is equal to the cardinality for said each byte position; and transforming each datetime value, in the set of datetime values, into a corresponding encoded value in the set of encoded values by performing the steps of:

for each set of one or more bytes, of said each datetime value, that corresponds to a byte position in the list of byte positions, determining from the encoding an entry that corresponds to the byte position of said each set of one or more bytes; and determining the corresponding encoded value for said each datetime value by combining, in accordance with the list of byte positions, the encoding entries that correspond to the sets of one or more bytes of said each datetime value;

storing the set of encoded values into persistent data storage; and wherein the steps are performed by one or more computing devices.

64. The computer system of claim 63, further comprising steps of:

retrieving the set of encoded values from the persistent data storage; and generating the set of datetime values from the set of encoded values that is retrieved from the persistent data storage, wherein generating the set of datetime values comprises determining, for each encoded value in the set of encoded values, a corresponding datetime value by performing steps comprising:

extracting each encoding entry from said each encoded value in accordance with the byte position, in the list of byte positions, that corresponds to said each entry; and determining each set of one or more bytes of the corresponding datetime value by using the encoding to decode the extracted entry that corresponds to said each set of one or more bytes.

65. The computer system of claim 63, wherein the set of datetime values is columnar data.

66. The computer system of claim 63, wherein storing the set of encoded values into the persistent data storage further comprises steps of:

compressing the set of encoded values into compressed data; and storing the compressed data in a compression unit that is stored on the persistent data storage.

* * * * *

UNITED STATES PATENT AND TRADEMARK OFFICE
CERTIFICATE OF CORRECTION

PATENT NO. : 8,239,421 B1  
APPLICATION NO. : 12/871862  
DATED : August 7, 2012  
INVENTOR(S) : Marwah et al.

Page 1 of 1

It is certified that error appears in the above-identified patent and that said Letters Patent is hereby corrected as shown below:

In column 20, line 40, after "sequence" insert -- . --.

In column 25, line 37, after ""348.06"" insert -- . --.

In column 31, line 14, delete "S18." and insert -- 518. --, therefor.

In column 31, line 15, delete "S18," and insert -- 518, --, therefor.

In column 31, line 19, delete "S18" and insert -- 518 --, therefor.

In column 31, line 31, delete "S18" and insert -- 518 --, therefor.

In column 33, line 50, delete ""30"" and insert -- and "30" --, therefor.

In column 36, line 15, after "performance" insert -- . --.

In column 46, line 20, in Claim 35, delete "steps:" and insert -- steps of: --, therefor.

In column 50, line 53, in Claim 57, delete "steps:" and insert -- steps of: --, therefor.

Signed and Sealed this  
Sixth Day of November, 2012

David J. Kappos  
*Director of the United States Patent and Trademark Office*